(12) United States Patent
Ravi et al.

(10) Patent No.: US 12,400,914 B2
(45) Date of Patent: Aug. 26, 2025

(54) SEMICONDUCTOR EXFOLIATION METHOD

(71) Applicant: ThinSiC Inc, Santa Clara, CA (US)

(72) Inventors: Tirunelveli Subramaniam Ravi, San Jose, CA (US); Stephen Daniel Miller, San Jose, CA (US); Jeffrey Scott Pietkiewicz, San Jose, CA (US); Kelly Marie Moyers, Santa Clara, CA (US)

(73) Assignee: ThinSiC Inc., Santa Clara, CA (US)

( * ) Notice: Subject to any disclaimer, the term of this patent is extended or adjusted under 35 U.S.C. 154(b) by 569 days.

(21) Appl. No.: 17/857,018

(22) Filed: Jul. 3, 2022

(65) Prior Publication Data

US 2024/0006243 A1   Jan. 4, 2024

(51) Int. Cl.

| | | |
|---|---|---|
| *H01L 21/78* | (2006.01) | |
| *C30B 25/04* | (2006.01) | |
| *C30B 25/20* | (2006.01) | |
| *C30B 29/36* | (2006.01) | |
| *C30B 33/02* | (2006.01) | |
| *H01L 21/02* | (2006.01) | |
| *H10D 8/01* | (2025.01) | |
| *H10D 8/60* | (2025.01) | |
| *H10D 62/832* | (2025.01) | |

(52) U.S. Cl.
CPC .......... *H01L 21/7813* (2013.01); *C30B 25/04* (2013.01); *C30B 25/20* (2013.01); *C30B 29/36* (2013.01); *C30B 33/02* (2013.01); *H01L 21/02378* (2013.01); *H01L 21/0243* (2013.01); *H01L 21/02529* (2013.01); *H10D 8/051* (2025.01); *H10D 8/60* (2025.01); *H10D 62/8325* (2025.01)

(58) Field of Classification Search
CPC .......... H01L 21/7813; H01L 21/02378; H01L 21/0243; H01L 21/02529; H01L 29/1608; H01L 29/6606; H01L 29/872; H01L 21/31144; H01L 21/02433; H01L 21/02444; H01L 21/02447; H01L 21/02494; H01L 21/02502; H01L 21/02642; H01L 21/02647; H01L 21/0262; C30B 25/04; C30B 25/20; C30B 29/36; C30B 33/02; C30B 33/06
See application file for complete search history.

(56) References Cited

U.S. PATENT DOCUMENTS

| | | |
|---|---|---|
| 6,770,507 B2 | 8/2004 | Abe et al. |
| 7,238,941 B2 | 7/2007 | Tai et al. |

(Continued)

*Primary Examiner* — George R Koch
*Assistant Examiner* — Christopher C Caillouet

(57) ABSTRACT

A semiconductor substrate comprising a first epitaxial silicon carbide layer and a second silicon carbide epitaxial layer. At least one semiconductor device is formed in or on the second silicon carbide epitaxial layer. The semiconductor substrate is formed overlying a silicon carbide substrate having a surface comprising silicon carbide and carbon. An exfoliation process is used to remove the semiconductor substrate from the silicon carbide substrate. The carbon on the surface of the silicon carbide substrate supports separation. A portion of the silicon carbide substrate on the semiconductor substrate is removed after the exfoliation process. The surface of the silicon carbide substrate is prepared for reuse in subsequent formation of semiconductor substrates.

20 Claims, 30 Drawing Sheets

(56) References Cited

U.S. PATENT DOCUMENTS

| | | |
|---|---|---|
| 7,790,226 B2 | 9/2010 | Tai et al. |
| 9,878,397 B2 | 1/2018 | Hirata et al. |
| 10,084,038 B2 | 9/2018 | Vecino Vazquez et al. |
| 10,304,739 B2 | 5/2019 | Nishibayashi et al. |
| 10,562,130 B1 | 2/2020 | Donofrio et al. |
| 10,576,585 B1 | 3/2020 | Donofrio et al. |
| 10,612,157 B2 | 4/2020 | Kubota et al. |
| 10,755,946 B2 | 8/2020 | Hirata et al. |
| 10,784,339 B2 | 9/2020 | Vecino Vazquez et al. |
| 10,825,733 B2 | 11/2020 | Bhalla et al. |
| 10,828,726 B2 | 11/2020 | Hirata et al. |
| 10,870,176 B2 | 12/2020 | Hirata |
| 10,872,757 B2 | 12/2020 | Hirata |
| 10,872,758 B2 | 12/2020 | Hirata |
| 10,903,078 B2 | 1/2021 | Schulze et al. |
| 10,978,311 B2 | 4/2021 | Drescher et al. |
| 11,031,483 B2 | 6/2021 | Schulze et al. |
| 11,081,393 B2 | 8/2021 | Beyer et al. |
| 11,211,459 B2 | 12/2021 | Brockmeier et al. |
| 2003/0056718 A1 | 3/2003 | Kawahara et al. |
| 2021/0225659 A1 | 7/2021 | Drescher et al. |
| 2021/0225709 A1 | 7/2021 | Rieske et al. |
| 2023/0009693 A1* | 1/2023 | Gao .................... H01L 21/7806 |

\* cited by examiner

SEMICONDUCTOR EXFOLIATION METHOD

FIELD

This invention relates to semiconductor substrates and, in particular to forming a semiconductor substrate comprising one or more epitaxial layers.

BACKGROUND

The use of wide bandgap (WBG) semiconductors has increased dramatically in recent years in power electronics. Their ability to operate efficiently at higher voltages, powers, temperatures, and switching frequencies has enabled reduced cooling requirements, lower part counts, and the use of smaller passive components. WBG-based power electronics can further reduce the footprint and potentially the system cost of various renewable energy electrical equipment such as motor drivers and inverters.

Among the WBG semiconductors for power electronics, Silicon Carbide (SiC) is now increasingly used for high voltage drivers (>1200V) whereas Gallium Nitride (GaN) has been experiencing increased use in both higher power and higher frequency applications. However, unlike silicon, the cost of a final device for WBG semiconductor devices is dominated by the cost of the materials. The materials include the substrate and the active layer grown by Epitaxy. The substrate by itself contributes to over half of the cost of a finished WBG semiconductor device.

From the substrate standpoint, 4H-Silicon carbide (SiC) Single Crystal Substrates have been used for both SiC and GaN devices since SiC and GaN epitaxial layers can be grown with reduced defects on SiC substrates. The GaN substrate, on the other hand, is very expensive to grow defect free and has not kept up with scaling size increases afforded with SiC substrates. While the SiC substrate quality has dramatically improved in the recent years, the cost has not come down since substrate fabrication is a complex process starting with vapor phase ingot growth followed by ingot cropping, then wire sawing of individual wafers, and finally grinding and polishing of the substrate, and as of now, there has been no proven practical method to eliminate any of these foregoing steps. As a semiconductor substrate for WBG semiconductors is being produced and devices that use high currents are fabricated, defects play a larger role and are magnified because die sizes are larger and any defect will contribute to more significant yield loss and potential lower reliability. Therefore, to maximize die yield, any cost reduction activity regarding the substrate is paramount while also maintaining low defect densities in the active device epitaxial layer. The effect of material defects is magnified due to larger die sizes which would therefore incorporate more material defects which would in each contribute to more significant yield loss and potentially lower reliability. Therefore, to maximize die yield and cost reduction activity regarding the substrate while also maintaining low defect densities in the active epitaxial layers is paramount.

Accordingly, it is desirable to provide methods to manufacture WBG semiconductors that overcome the thin substrate limitation and reduce the contribution of the substrate to the final die with minimal effect to the yield or performance parameters of the final WBG semiconductor.

BRIEF DESCRIPTION OF THE DRAWINGS

Various features of the system are set forth with particularity in the appended claims. The embodiments herein, can be understood by reference to the following description, taken in conjunction with the accompanying drawings, in which:

FIG. 28 illustrates a portion of reusable silicon carbide substrate after polishing and reclaim in accordance with an example embodiment;

DETAILED DESCRIPTION

Figure 1:
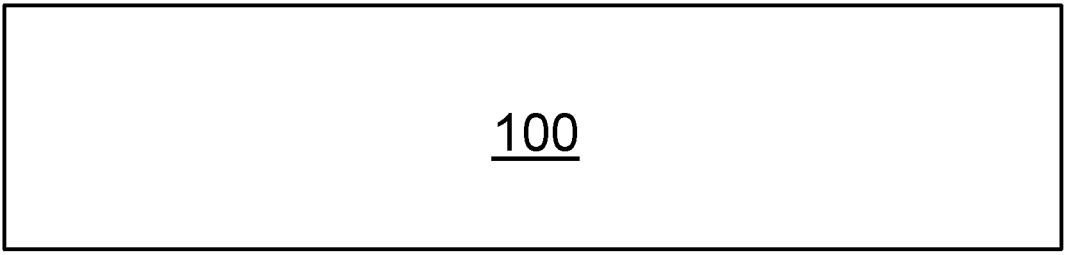
FIG. 1 illustrates a reusable silicon carbide (SiC) single crystal substrate in accordance with an example embodiment.

The following description of embodiment(s) is merely illustrative in nature and is in no way intended to limit the invention, its application, or uses.

For simplicity and clarity of the illustration(s), elements in the figures are not necessarily to scale, are only schematic, are non-limiting, and the same reference numbers in different figures denote the same elements, unless stated otherwise. Additionally, descriptions and details of well-known steps and elements are omitted for simplicity of the description. Notice that once an item is defined in one figure, it may not be discussed or further defined in the following figures.

The terms "first", "second", "third" and the like in the Claims or/and in the Detailed Description are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Processes, techniques, apparatus, and materials as known by one of ordinary skill in the art may not be discussed in detail but are intended to be part of the enabling description where appropriate.

While the specification concludes with claims defining the features of the invention that are regarded as novel, it is believed that the invention will be better understood from a consideration of the following description in conjunction with the drawing figures, in which like reference numerals are carried forward.

The current invention is described with an example embodiment of the fabrication of a Schottky Barrier Diode (SBD) using a silicon carbide wafer as the starting substrate. The starting substrate used is a semiconductor substrate that can be used as a reusable semiconductor substrate multiple times for fabrication of semiconductor devices. Alternatively, other devices such as transistors, passive devices, or power transistors can be formed using the described process flow. While silicon carbide substrate is used in the example embodiment, the invention can be implemented in other semiconductor substrates such as gallium nitride, gallium arsenide, indium phosphide, silicon, silicon on insulator (SOI) among others. In addition, the invention may be used in other semiconductor devices such as photonic devices, lasers, light emitting diodes, RF devices, among others.

FIG. 1 is an illustration of a reusable silicon carbide substrate 100 in accordance with an example embodiment. Silicon carbide substrate 100 is used as a starting material for the fabrication of the Schottky Barrier Diode. In one embodiment, silicon carbide substrate 100 is a crystalline 4H silicon carbide wafer with a preferred crystalline orientation of <0001> with an offcut towards <1120> of 4 degrees. In one embodiment, a thickness of silicon carbide substrate 100 is in the range of 300-400 microns. In one embodiment, silicon carbide substrate 100 may be a single side polished or double side polished wafer and can be considered as the parent wafer, for considerations that are described in subsequent process steps in the implementation of the current invention. In one embodiment, silicon carbide substrate 100 is the basic platform on which the example embodiment is implemented to support the process flow in accordance with the current invention. Silicon carbide substrate 100 is a reusable semiconductor substrate that is used for fabrication of semiconductor devices multiple times on the same substrate, in accordance with the current invention.

Figure 2:
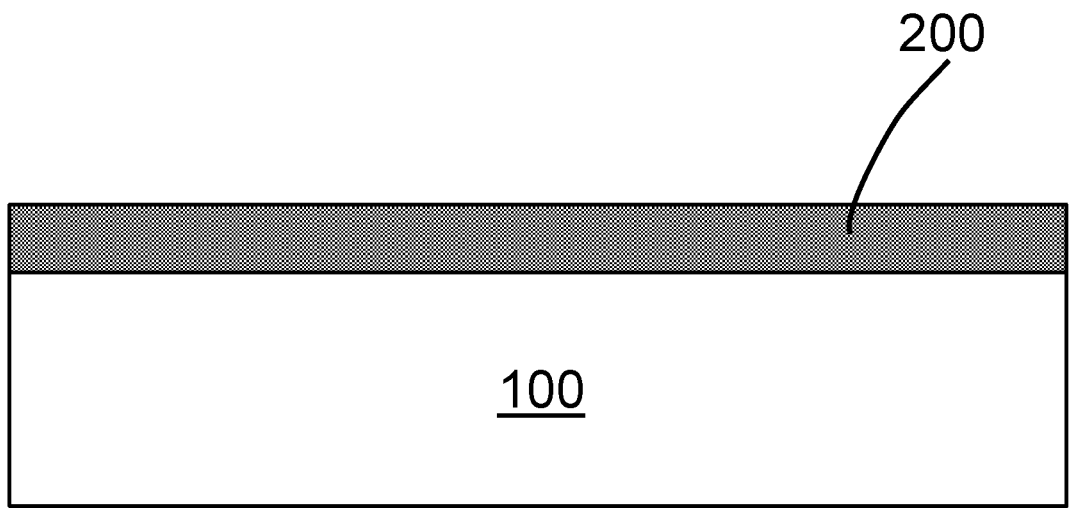
FIG. 2 illustrates a carbon layer over the silicon carbide substrate in accordance with an example embodiment.

FIG. 2 is an illustration of a layer 200 formed overlying silicon carbide substrate 100 in accordance with an example embodiment. In one embodiment layer 200 comprises a carbon material and is formed on a surface of silicon carbide substrate 100. In one embodiment, layer 200 is formed on the surface of silicon carbide substrate 100 using a variety of methods. In one embodiment, layer 200 is formed on the surface of silicon carbide substrate 100 using sputtered carbon. In another embodiment, layer 200 is deposited using CVD (Chemical Vapor Deposition) or PVD (Physical Vapor Deposition) among other techniques.

In another embodiment, layer 200 is formed on the surface of silicon carbide substrate 100 by depositing a polymer layer and then converting the polymer layer into a carbon layer using pyrolysis. In one embodiment, the polymer layer is composed of Parylene. Parylene (trade name for poly p-xylylene) is a semicrystalline thermoplastic polymer deposited using CVD (Chemical Vapor Deposition). Parylene C is one version of parylene which is a chlorinated poly para-xylylene polymer and is deposited using CVD (Chemical Vapor Deposition) to form a conformal coating. Parylene C deposition consists of heating a solid, granular material called dimer under vacuum to vaporize into a dimeric gas in a temperature range of (100-150) ° C. The dimeric gas is then pyrolyzed to cleave the dimer into its monomeric form. The monomer gas is then used in a vacuum chamber at room temperature to deposit conformally on all surfaces of the samples inside a vacuum chamber as a polymer film. In one embodiment, silicon carbide substrate 100 is coated with polymer layer of Parylene C conformally. The thickness of Parylene C is in a range of 500 nanometers (nm) to several micrometers (um). The deposited Parylene C is converted into layer 200 which is a carbon layer using a process of pyrolysis. The pyrolysis of Parylene C into carbon is done in an inert environment. The pyrolysis of Parylene C converts the Parylene C into a carbon layer which may be amorphous or polycrystalline. In one embodiment, the temperature for pyrolysis is between (600-1200) ° C. and the inert environment is nitrogen or a forming gas (nitrogen and hydrogen) among others. In one embodiment, to account for the shrinkage of the Parylene C during the pyrolysis process, multiple layers of Parylene C are deposited and converted to carbonized layer to achieve the target thickness of carbon layer 200.

In one embodiment, the polymer layer is composed of photoresist. The photoresist used as the polymer may be of positive or negative polarity. In one embodiment, polymer photoresist layer is spin coated on the surface of silicon carbide substrate 100. Photoresist polymer layer may also be spray coated on surface of silicon carbide substrate 100. In one embodiment, after the deposition of the polymer photoresist it is soft baked to drive out solvents. Soft baking polymer photoresist means that it is heated to a temperature in the range of (90-100) ° C. in an inert environment such as nitrogen to drive out solvents. Multiple layers of polymer photoresist may be used to achieve the desired thickness of polymer photoresist.

Polymer photoresist layer deposited on surface of silicon carbide substrate 100 is converted to carbon layer 200 by process of pyrolysis. Pyrolysis of polymer photoresist layer consists of thermal treatment in an inert environment to form carbon layer 200. Pyrolysis of polymer photoresist layer into carbon layer 200 can comprise multiple intermediate thermal treatments. In one embodiment, polymer photoresist layer is baked in nitrogen environment at 90° C. (typically called a soft bake), followed by bake at 115° C. (typically called a hard bake) in the nitrogen environment. Hard baked polymer photoresist layer is then cured at 450° C. in the nitrogen environment and then pyrolyzed in a furnace in the nitrogen environment at (800-1200) ° C. to convert the polymer photoresist layer to carbon layer 200. In another embodiment, a forming gas (nitrogen and hydrogen) is used for the pyrolysis of polymer photoresist layer to carbon layer 200.

Figure 3:
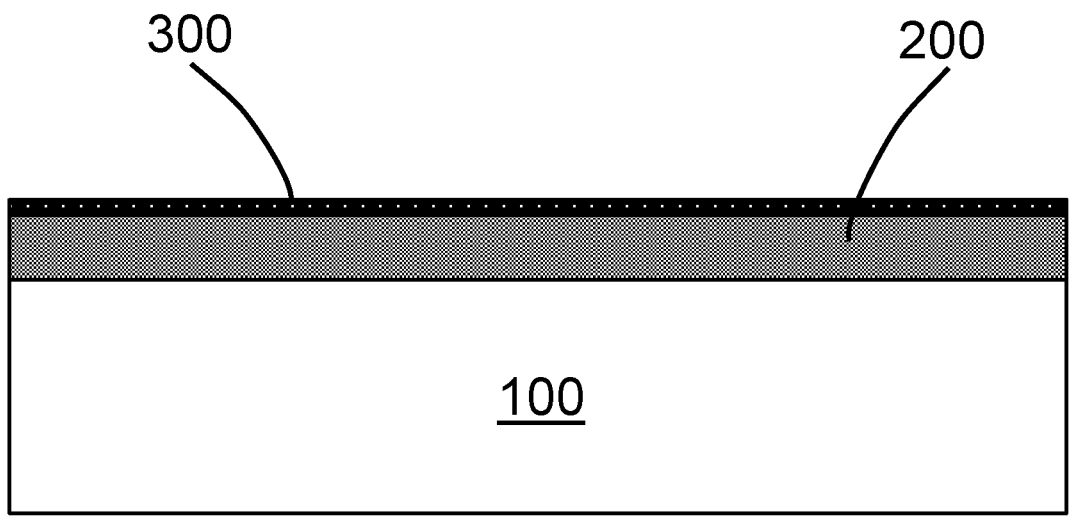
FIG. 3 illustrates a hard mask overlying a carbon layer overlying a silicon carbide substrate in accordance with an example embodiment.

FIG. 3 is an illustration of a hard mask layer 300 deposited overlying carbon layer 200 on silicon carbide substrate 100 in accordance with an example embodiment. In one embodiment, hard mask layer 300 is deposited on a surface of carbon layer 200. Hard mask layer 300 is deposited using techniques such as CVD (Chemical Vapor Deposition), LPCVD (low pressure chemical vapor deposition), PECVD (Plasma Enhanced Chemical Vapor Deposition), APCVD (Atmospheric Pressure Chemical Vapor Deposition), SACVD (Sub Atmospheric Chemical Vapor Deposition), PVD (Physical Vapor Deposition), or ALD (Atomic layer Deposition). In the example implementation, hard mask layer 300 is composed of $Al_2O_3$ deposited using ALD (Atomic Layer Deposition) The thickness of hard mask layer 300 is determined by the specific requirements of the implementation and is well known to those skilled in the art and is the range of 20-300 nm.

Figure 4:
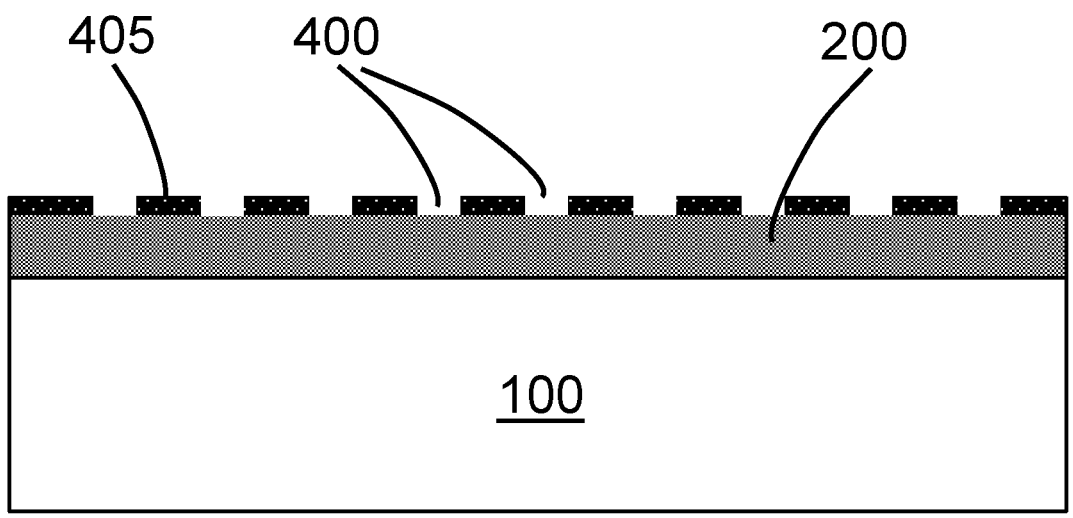
FIG. 4 illustrates a patterned hard mask overlying a carbon layer overlying a silicon carbide substrate in accordance with an example embodiment.

FIG. 4 is an illustration of a plurality of openings 400 formed in hard mask layer 300 of FIG. 3 in accordance with an example embodiment. In one embodiment, the process steps disclosed herein below will lead to the formation of a device in substrate 100 and more specifically a Schottky Barrier Diode as an example semiconductor device. Hard mask layer 300 of FIG. 3 deposited over the carbon layer 200 over surface of substrate 100 is patterned to subsequently support the formation of plurality of openings 400. In one embodiment, the surface of carbon layer 200 is exposed by removal of hard mask layer 300 to form plurality of openings 400. Plurality of openings 400 are formed in hard mask layer 300 using methods of lithography and etching common to the semiconductor industry. Patterned hard mask 405 is left in areas to protect portions of carbon layer 200 from being etched. The shape of plurality of openings 400 are determined by the requirements of epitaxial growth in subsequent steps in the implementation of the example embodiment. In one embodiment, plurality of openings 400 may be in the shape of squares or rectangles. In another embodiment, plurality of openings 400 may be in the shape of triangles, hexagons or diamonds. In another embodiment, plurality of openings 400 may be in the shape of stripes which may be horizontal, vertical, or sloped at a diagonal angle. In one embodiment, the size of plurality of openings 400 may be in the range of (20-500) nm and determined by the requirements of epitaxial overgrowth in the subsequent steps of fabrication of the example device. In one embodiment, spacing between adjacent openings of plurality of openings 400 is determined by the requirements of epitaxial overgrowth in the subsequent steps of fabrication of the example device and can be in the range of 500 nm to 5 micrometers. Plurality of openings 400 are generated on a surface of hard mask layer 300 of FIG. 3 by using lithography techniques that are well known to those skilled in the art. In one embodiment, plurality of openings 400 are implemented using optical lithography using UV, DUV or EUV. In another embodiment, plurality of openings 400 are implemented using an electron beam direct write technique.

In yet another embodiment, plurality of openings 400 are implemented using Nano-Imprint Lithography (NIL).

In one example embodiment, plurality of openings 400 are implemented by first coating a surface of hard mask layer 300 with a photosensitive layer of photoresist, which may be positive or negative in its chemistry. In the example embodiment, positive photoresist is used in coating the surface of hard mask layer 300. An optical tool called a stepper is used to transfer the pattern of openings on to the positive photoresist layer using chemistries that are well known to those skilled in the art. The choice of the photoresist layer, thickness of the photoresist layer, the exposure and develop times for the subsequent chemical steps are well known to those skilled in the art and determined by the requirements of accurate pattern transfer from the photoresist layer to hard mask layer 300 to subsequently form plurality of openings 400. The stepper transfers the pattern of plurality of openings 400 to cover the surface of hard mask layer 300 over carbon layer 200 over silicon carbide substrate 100.

After the pattern transfer is completed using lithography, the next step is the patterning of hard mask layer 300 using etching techniques to selectively remove the hard mask layer 300 of FIG. 3 overlying carbon layer 200 on silicon carbide substrate 100 leaving patterned hard mask 405 on carbon layer 200 over substrate 100. The selective removal of hard mask layer 300 to form patterned hard mask 405 may use Reactive Ion Etching (RIE). Different gases may be used to form a plasma to selectively remove the portions of hard mask layer 300 exposed by the patterned photoresist. The choice of gases for the RIE is determined by hard mask layer 300 used in the implementation. In the example embodiment, with $Al_2O_3$ layer used as hard mask layer 300, fluorine-based chemistries such as $SF_6$, $CF_4$, $CHF_3$, and other gases may be used in the RIE. Accordingly, in the example embodiment with $Al_2O_3$ layer as hard mask layer 300, plurality of openings 400 are etched in hard mask layer 300 using a fluorine-based chemistry that exposes the surface of carbon layer 200 in plurality of openings 400. Patterned hard mask 405 remains in areas overlying carbon layer 200 to protect or mask the surface of carbon layer 200 from etching.

Figure 5:
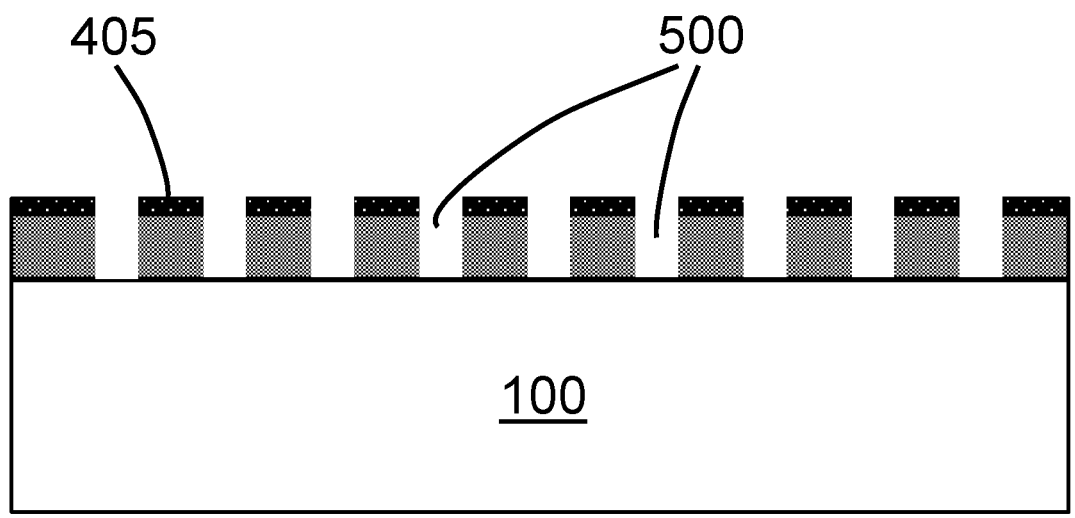
FIG. 5 illustrates a plurality of trenches etched in carbon layer forming patterned carbon regions overlying a silicon carbide substrate in accordance with an example embodiment.

FIG. 5 is an illustration of a plurality of trenches 500 formed in carbon layer 200 in accordance with an example embodiment. Plurality of trenches 500 expose a surface of silicon carbide substrate 100 after etching carbon layer 200 exposed by plurality of openings 400 from FIG. 4. Thus, the exposed surface of carbon layer 200 over silicon carbide substrate 100 in plurality of openings 400 is etched to form plurality of trenches 500 in FIG. 5 using RIE (Reactive Ion Etching). In one embodiment, carbon layer 200 is etched using patterned hard mask 405 to form plurality of trenches 500 with an aspect ratio that is determined by the requirements of epitaxial growth in subsequent processing of the example device. Thus, plurality of openings 400 are etched in the carbon layer 200 to expose the surface of silicon carbide substrate 100 to form plurality of trenches 500. The depth of plurality of trenches 500 is dependent on the thickness of carbon layer 200 and may be in the range of 500 nm to 3 micrometers. An oxygen plasma with fluorine chemistry or argon may be used for etching carbon layer 200 using patterned hard mask 405. An inductively coupled plasma (ICP) with high density may also be used to form plurality of trenches 500 using patterned hard mask 405 over carbon layer 200 over silicon carbide substrate 100. After plurality of trenches 500 are formed by etching the exposed surfaces of plurality of openings 400 in carbon layer 200 over silicon carbide substrate 100, the photoresist is removed using resist stripping techniques well known to those skilled in the art. The resist stripping technique may use dry etching or wet etching or a combination of dry and wet stripping techniques.

Figure 6:
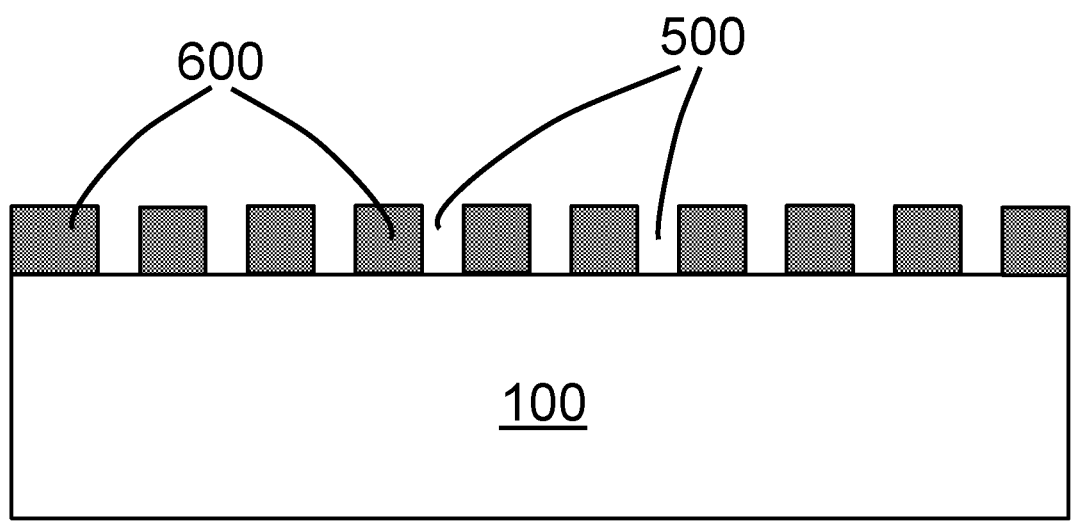
FIG. 6 illustrates the silicon carbide substrate with plurality of trenches in carbon layer forming patterned carbon regions after removal of patterned hard mask in accordance with an example embodiment.

FIG. 6 is an illustration of an example embodiment where patterned hard mask 405 is removed forming a plurality of trenches 500 in accordance with an example embodiment. FIG. 6 further illustrates plurality of patterned carbon regions 600 formed overlying silicon carbide substrate 100. Patterned hard mask 405 of FIG. 5 is removed using wet etching, dry etching or a combination of wet etching and dry etching, depending on hard mask layer 300. In an example embodiment, hard mask layer 300 of FIG. 3 comprises $Al_2O_3$ that is etched using dilute BOE (Buffered Oxide Etch). Silicon carbide substrate 100 with plurality of patterned carbon regions 600 and plurality of trenches 500 is then cleaned in preparation for the next step in the fabrication of the example device. In one embodiment, the pattern of plurality of trenches 500 are shaped as triangles or hexagons to expose (1120) or equivalent crystal planes since these orientations facilitate high quality epitaxial overgrowth with low defect density in subsequent processing steps in accordance with the current invention.

Figure 7:
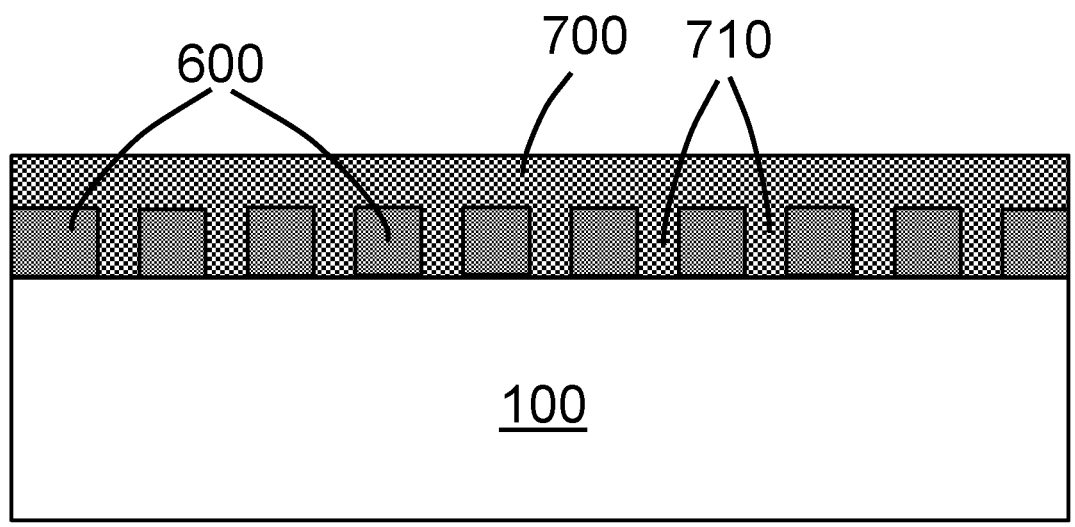
FIG. 7 illustrates an epitaxially grown layer with merged epitaxial lateral overgrowth (MELO) over patterned carbon regions in silicon carbide substrate in accordance with an example embodiment.

FIG. 7 is an illustration of an epitaxial layer 700 formed overlying the surface of patterned carbon regions 600 in accordance with an example embodiment. In one embodiment, epitaxial layer 700 is a silicon carbide epitaxial layer formed over patterned carbon regions 600 and coupling to silicon carbide substrate 100. Epitaxial layer 700 may be a N+ heavily doped layer forming a buffer epitaxial layer. In one embodiment, epitaxial layer 700 forms a plurality of silicon carbide pillars 710 between the patterned carbon regions 600 by epitaxial growth of silicon carbide from surface of silicon carbide substrate 100 in plurality of openings 500 from FIG. 6.

In general, epitaxial layer 700 is formed on silicon carbide substrate 100 with patterned carbon regions 600 overlying silicon carbide substrate 100 in a silicon carbide epitaxial reactor. In the epitaxial reactor, silicon carbide grows with the crystalline orientation of exposed silicon carbide substrate 100 in plurality of openings 500 from FIG. 6. In the epitaxial reactor, silicon carbide grows vertically as well as laterally with patterned carbon regions 600 inhibiting the epitaxial growth with growth conditions that are well known to those skilled in the art. The silicon carbide forms array of silicon carbide pillars 710 due to the vertical growth of silicon carbide and then forms epitaxial layer 700 when it grows laterally. Note that silicon carbide pillars 710 corresponds to silicon carbide between adjacent patterned carbon regions 600. Once above patterned carbon regions 600, the silicon carbide grows as a uniform layer.

The lateral fronts of the epitaxial regions of silicon carbide epitaxial layer 700 merge due to epitaxial lateral overgrowth (ELO) or merged epitaxial lateral overgrowth (MELO). The process of epitaxial crystal growth is used to form a single crystal layer of silicon carbide over patterned carbon regions 600 forming epitaxial layer 700 with silicon carbide pillars 710. In the example embodiment, epitaxial layer 700 is an epitaxial layer of silicon carbide. This method of ELO or MELO over the regions of patterned carbon 600 enables the formation of epitaxial layer 700 with low defect density which is mechanically supported by patterned carbon regions 600 and plurality of silicon carbide pillars 710. Silicon carbide substrate 100 with patterned carbon regions 600 and plurality of silicon carbide pillars 710 below epitaxial layer 700 forms a plane where epitaxial layer 700 can be exfoliated from substrate 100 in subsequent process steps. The patterned carbon regions 600 along with plurality of pillars 710 enables the formation of epitaxial layer 700 as a single crystal silicon carbide layer by ELO or MELO. This plane of separation comprises patterned carbon regions 600 and plurality of pillars 710. In one embodiment, epitaxial layer 700 is grown in an epitaxial reactor using CVD (Chemical Vapor Deposition) epitaxial growth processes or by modified bulk crystal growth processes such as high Temperature CVD or by Physical Vapor Transport (PVT). The exfoliation process of separating substrate 100 from epitaxial layer 700 will be disclosed in detail herein below.

Patterned carbon regions 600 is compatible with the epitaxial growth process since carbon is incorporated in the silicon carbide crystalline structure during the epitaxial growth where gases such as acetylene ($C_2H_2$) is used in the epitaxial reactor along with other process gases such as DCS (Dichlorosilane), TCS (trichlorosilane), silane among other process gases. Patterned carbon regions 600 may be amorphous or polycrystalline depending on the method of forming the carbon layer 200 from FIG. 2 and is capable of withstanding high temperature processing of the silicon carbide devices formed above epitaxial layer 700 in subsequent process steps. In addition, carbon has a Young's modulus of 70 GPa compared to 700 GPa of singe crystal silicon carbide.

By appropriate design of mechanical and thermal consideration of patterned carbon regions 600 with plurality of silicon carbide pillars 710, the forces required for exfoliation of single crystal silicon carbide epitaxial layer 700 may be tailored to be optimized such that the entire structure can withstand the thermal and mechanical processes during subsequent device formation steps while also being able to be separated by the exfoliation process in the plane of the patterned carbon regions 600 with plurality of silicon carbide pillars 710. In the example embodiment, epitaxial layer 700 comprises of N+4H Silicon Carbide and can be of a thickness of about 5-20 micrometers. In another embodiment, P+ silicon carbide can be used for epitaxial layer 700. The doping of epitaxial layer 700 is high enough to provide an ohmic contact for the silicon carbide device formed on epitaxial layer 700 during subsequent processing steps. Patterned carbon regions 600 inhibits the growth of silicon carbide epitaxial layer over it while enabling the lateral growth of silicon carbide from plurality of silicon carbide pillars 710 that grow from surface of reusable silicon carbide substrate 100 and also forms a portion of the plane where exfoliation is initiated in a later stage of the invention, as described in more detail in subsequent processing steps.

Figure 8:
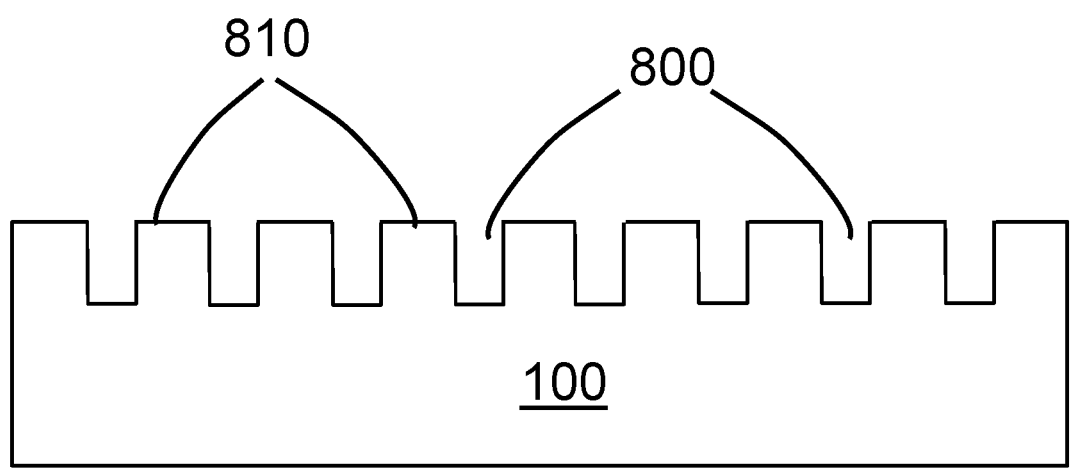
FIG. 8 illustrates a reusable silicon carbide (SiC) single crystal substrate with plurality of trenches and plurality of pillars of silicon carbide in accordance with an example embodiment.

FIG. 8 is an illustration of silicon carbide substrate 100 patterned to form a plurality of trenches 800 and a plurality of silicon carbide pillars 810 in accordance with an alternate example embodiment. In one embodiment, pattern of plurality of trenches 800 is formed by coating silicon carbide substrate with a hard mask layer for patterning and etching. The hard mask layer used for patterning of trenches 800 may be composed of one or more layers. In one embodiment, the hard mask layer is composed of LPCVD Silicon Nitride coated with LPCVD silicon oxide. The hard mask layers are patterned using photoresist and optical lithography and etched using reactive ion etching (RIE). In one embodiment, hard mask layers of silicon nitride and silicon oxide are patterned using RIE using fluorine chemistry. After the patterning and etching of the hard mask layers, silicon carbide substrate 100 is etched using Reactive Ion Etching using a fluorine chemistry to form plurality of trenches 800 and leaving plurality of silicon carbide pillars 810. Inductively Coupled Plasma (ICP) may also be used to etch silicon carbide substrate 100. After etching of plurality of trenches 800 and formation of plurality of silicon carbide pillars 810, hard mask layers are stripped using wet etching, dry etching or a combination of wet and dry etching. The aspect ratio of the plurality of pillars of silicon carbide may be between 2-10.

Figure 9:
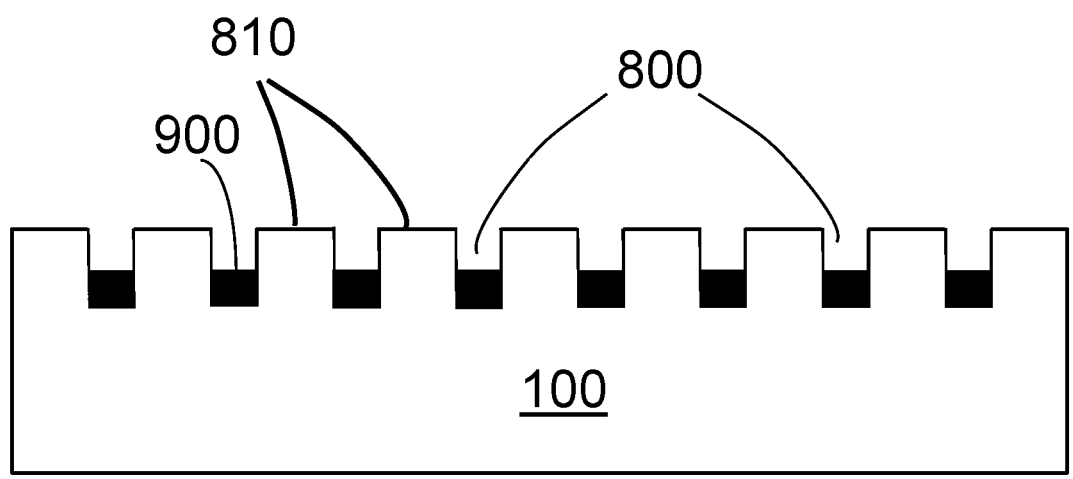
FIG. 9 illustrates a reusable silicon carbide (SiC) single crystal substrate with plurality of trenches partially filled with a carbon layer and plurality of pillars of silicon carbide in accordance with an example embodiment.

FIG. 9 is an illustration of silicon carbide substrate 100 patterned with plurality of trenches 800 filled with a carbon layer 900 partially filling plurality of trenches 800 in accordance with the alternate embodiment. Carbon layer 900 partially filling plurality of trenches 800 can be formed by sputter deposition of a carbon film on the surface of silicon carbide substrate 100 patterned with a plurality of trenches 800 and partially filled with carbon layer 900 by blanket etching of carbon film deposited on surface of silicon carbide substrate 100. Carbon layer 900 is removed from surfaces of plurality of silicon carbide pillars 810. In one embodiment, carbon layer 900 may be formed by deposition of a polymer on surface of silicon carbide substrate 100, etching back from top of plurality of silicon carbide pillars 810 and pyrolysis of polymer layer to form carbon layer 900 partially filling plurality of trenches 800. Polymer layer used for pyrolysis may be deposited by CVD (Chemical Vapor Deposition), PVD (Physical Vapor Deposition), spin coating, spray coating among other techniques.

Figure 10:
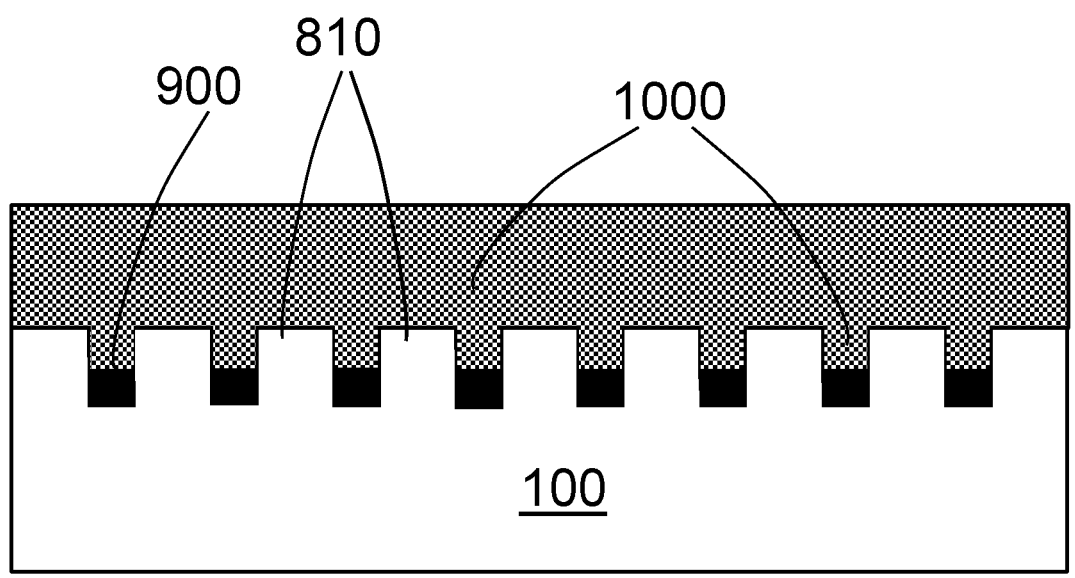
FIG. 10 illustrates an epitaxially grown layer with merged epitaxial lateral overgrowth (MELO) with plurality of trenches partially filled with a carbon layer and plurality of pillars of silicon carbide in accordance with an example embodiment.

FIG. 10 is an illustration of an epitaxial layer 1000 formed over silicon carbide substrate 100 in accordance with the alternate embodiment. In one embodiment, epitaxial layer 1000 is a silicon carbide epitaxial layer forming a buffer epitaxial layer with low defect density. Epitaxial layer 1000 is formed by placing silicon carbide substrate 100 with plurality of trenches 800 from FIG. 9 partially filled with carbon layer 900 in a silicon carbide epitaxial reactor with epitaxial growth of silicon carbide using ELO (Epitaxial Lateral Overgrowth) or MELO (Merged Epitaxial Lateral Overgrowth) to form a single crystal epitaxial layer 1000. In the example, single crystal epitaxial layer 1000 overlies silicon carbide substrate 100, carbon layer 900, and plurality of pillars 810.

Figure 11:
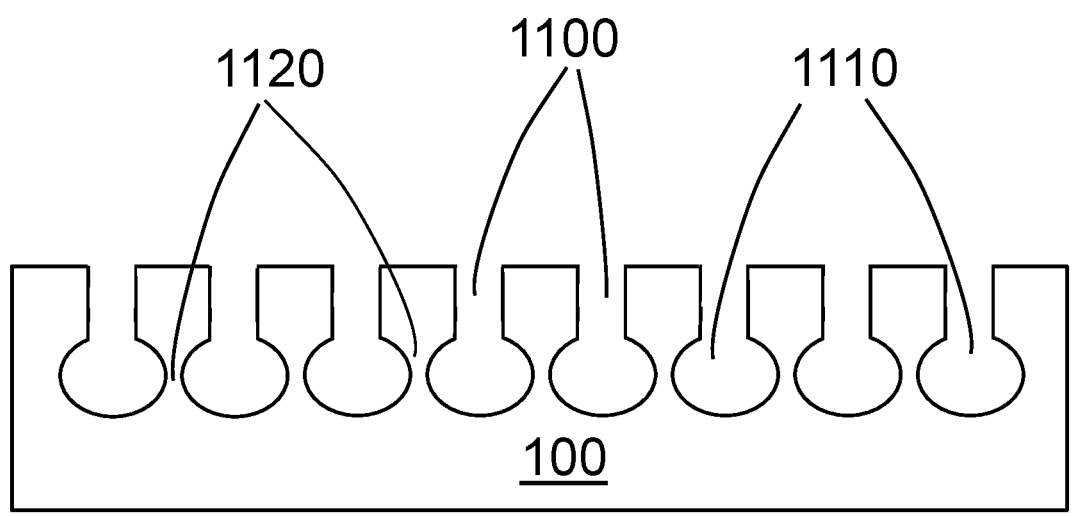
FIG. 11 illustrates a reusable silicon carbide (SiC) single crystal substrate with plurality of trenches overlying a plurality of micro-voids and plurality of pillars of silicon carbide in accordance with an example embodiment.

FIG. 11 is an illustration of silicon carbide substrate 100 patterned with a plurality of trenches 1100 having a plurality of micro-voids 1110 in accordance with an alternate embodiment. In one embodiment, a pattern corresponding to plurality of trenches 1100 is formed by coating silicon carbide substrate with a hard mask layer for patterning and etching. Hard mask layer used for patterning of plurality of trenches 1100 may be composed of one or more layers. In one embodiment, the hard mask layer is composed of LPCVD Silicon Nitride. The hard mask layer is patterned using photoresist and optical lithography and etched using reactive ion etching (RIE). In one embodiment, the hard mask layer of silicon nitride is patterned using RIE with a fluorine chemistry. After the patterning and etching of the hard mask layers, silicon carbide substrate 100 is etched using Reactive Ion Etching with the fluorine chemistry to form plurality of trenches 1100. Inductively Coupled Plasma (ICP) may also be used to etch silicon carbide substrate 100. After etching of plurality of trenches 1100, a conformal layer of a spacer layer is deposited and etched to form spacers in the walls of trenches 1100. The plurality of micro-voids 1110 are then etched in silicon carbide substrate 100 using isotopic etching chemistry below plurality of trenches 1100. In one embodiment, plurality of micro-voids are wider than the plurality of trenches 1100 and form plurality of pillars 1120. Plurality of pillars 1120 correspond to the silicon carbide between adjacent micro-voids of plurality of micro-voids 1110. After forming of trenches 1100 with plurality of micro-voids 1110 below plurality of trenches 1100 and leaving plurality of pillars 1120 in silicon carbide substrate 100, the hard mask layer and spacer layer is removed using wet chemistry. If the hard mask layer and spacer layer is silicon nitride, hot phosphoric acid is used for the removal of hard mask layer and spacer layer.

Figure 12:
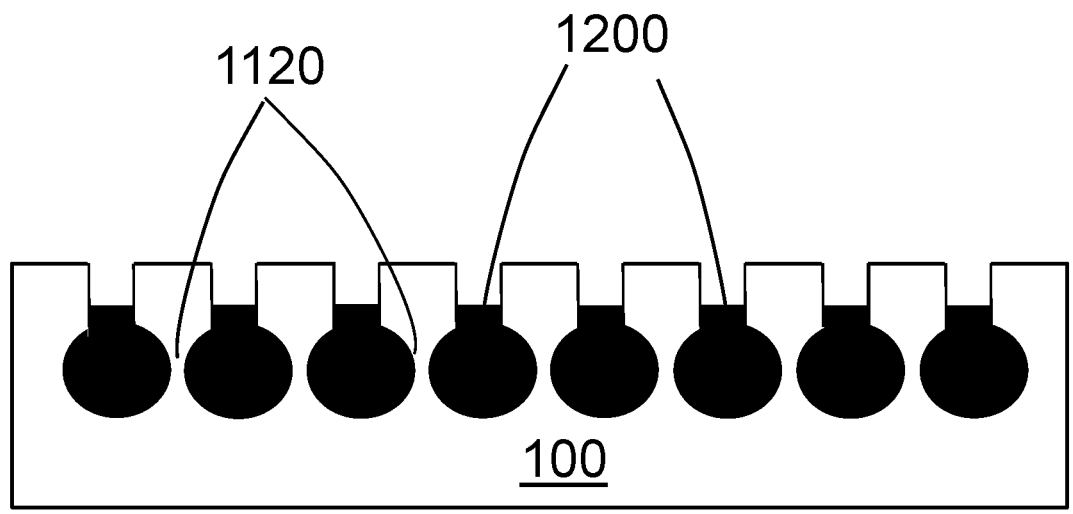
FIG. 12 illustrates a reusable silicon carbide (SiC) single crystal substrate with plurality of trenches partially filled with a carbon layer overlying a plurality of micro-voids completely filled with a carbon layer and plurality of pillars of silicon carbide in accordance with an example embodiment.

FIG. 12 is an illustration of silicon carbide substrate 100 patterned with a plurality of trenches 1100 over a plurality of micro-voids 1110 from FIG. 11 filled with a carbon layer 1200 partially filling plurality of trenches 1100 and completely filling plurality of micro-voids 1110 in accordance with the alternate embodiment. Carbon layer 1200 partially filling plurality of trenches 1100 can be formed by sputter deposition of a carbon film on the surface of silicon carbide substrate 100 patterned with a plurality of trenches 1100 and plurality of micro-voids 1110 and blanket etching of carbon film deposited on the surface of silicon carbide substrate 100 with plurality of trenches 1100. In one embodiment, carbon layer 1200 may be formed by deposition of a polymer on the surface of silicon carbide substrate 100, etching back from a top of plurality of silicon carbide pillars 1120, and pyrolysis of the polymer layer to form carbon layer 1200 partially filling plurality of trenches 1100 and completely filling plurality of micro-voids 1110. Polymer layer used for pyrolysis to form carbon layer 1200 may be deposited by CVD (Chemical Vapor Deposition), PVD (Physical Vapor Deposition), spin coating, spray coating among other techniques.

Figure 13:
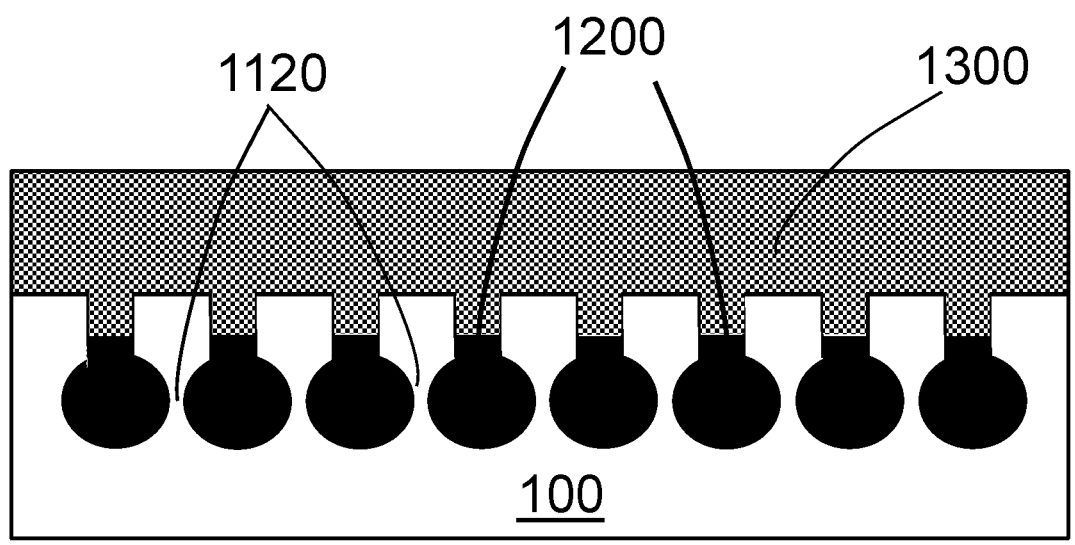
FIG. 13 illustrates an epitaxially grown layer with merged epitaxial lateral overgrowth (MELO) with plurality of trenches partially filled with a carbon layer overlying a plurality of micro-voids completely filled with a carbon layer and plurality of pillars of silicon carbide in accordance with an example embodiment.

FIG. 13 is an illustration of an epitaxial layer 1300 over silicon carbide substrate 100 patterned in accordance with the alternate embodiment. In one embodiment, epitaxial layer 1300 is a silicon carbide epitaxial layer forming a buffer epitaxial layer with low defect density. Epitaxial layer 1300 is formed by placing silicon carbide substrate 100 with plurality of trenches 1100 from FIG. 11 partially filled with carbon layer 1200 over a plurality of micro-voids 1110 completely filled with carbon layer 1200 in a silicon carbide epitaxial reactor with epitaxial growth of silicon carbide using ELO (Epitaxial Lateral Overgrowth) or MELO (Merged Epitaxial Lateral Overgrowth) to form a single crystal epitaxial layer 1300 with patterned carbon layer 1200 with a plurality of silicon carbide pillars 1120.

Figure 14:
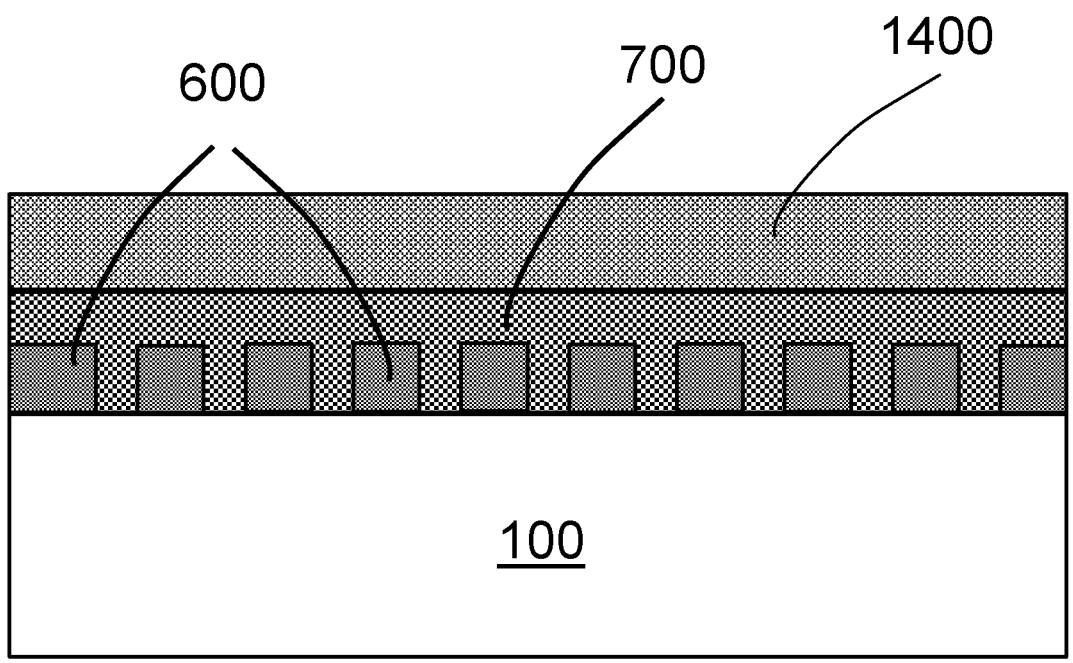
FIG. 14 illustrates an epitaxially grown layer over an epitaxially grown epitaxial layer with merged epitaxial lateral overgrowth (MELO) over patterned carbon regions with silicon carbide pillars in silicon carbide substrate in accordance with an example embodiment.

FIG. 14 is an illustration of an epitaxial layer 1400 formed overlying epitaxial layer 700 in accordance with an example embodiment. In one embodiment, a device is formed in epitaxial layer 1400 that is grown overlying epitaxial layer 700 in an epitaxial reactor. In one embodiment, epitaxial layer 1400 comprises silicon carbide. In an example embodiment, the device that is formed in epitaxial layer 1400 is a silicon carbide device that is formed in subsequent processing steps. In one embodiment, prior to the epitaxial growth of epitaxial layer 1400, a surface of epitaxial layer 700 may be lightly polished using a polishing step called kiss polish to remove any surface defects on the surface of epitaxial layer 700. In one embodiment, the doping and thickness of device epitaxial layer 1400 are determined by the electrical requirements of devices that are formed in device epitaxial layer 1400. In one embodiment, the thickness of device epitaxial layer 1400 is determined by a breakdown voltage of the device formed in the epitaxial layer 1400 in subsequent processing steps and is typically between 10-30 micrometers. In the example embodiment, epitaxial layer 1400 is doped N- and has a thickness of about 10-12 micrometers for a device breakdown voltage of 1200 Volts. Epitaxial layer 1400 formed overlying epitaxial layer 700 is used for formation of silicon carbide devices using processes well known to those skilled in the art. In the example embodiment, epitaxial layer 1400 is used for formation of a Schottky Barrier Diode in accordance with the current invention. It should be noted that epitaxial layer 1400 can be formed overlying any of the different embodiments comprising the ELO and MELO epitaxial layer disclosed herein. Also, any subsequent processing steps can also be performed in all the different embodiments disclosed herein.

In one embodiment, device epitaxial layer 1400 overlying epitaxial layer 700 enables the formation of silicon carbide devices that can subsequently be separated from silicon carbide substrate 100 by method of an exfoliation process that may be thermal, mechanical, and other techniques. A combination of techniques may also be used in the exfoliation process of device epitaxial layer 1400 and epitaxial layer 700 on which semiconductor devices can be fabricated. It should be also noted that the exfoliation process disclosed herein supports reuse of silicon carbide substrate 100 as epitaxial layer 1400 comprises only a portion of silicon carbide substrate 100. In one embodiment, a surface of silicon carbide substrate 100 can be prepared to be reused to form more devices.

In one embodiment, device epitaxial layer 1400 overlying epitaxial layer 700 may be grown to a thickness of (150-400) microns to enables the formation of silicon carbide substrate that can subsequently be separated from silicon carbide substrate 100 by method of an exfoliation process thereby enabling formation of kerfless silicon carbide substrate. In one embodiment, device epitaxial layer 1400 may be very lightly doped to act as a semi-insulating substrate.

Figure 15:
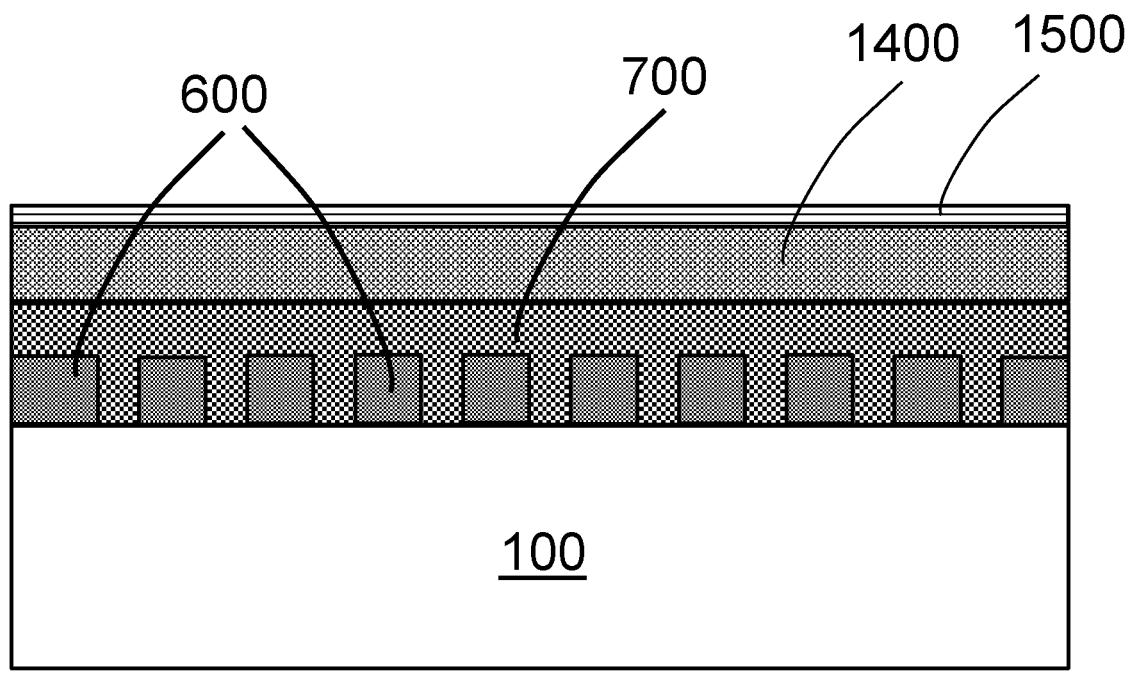
FIG. 15 illustrates a diode contact region in an epitaxially grown layer over an epitaxially grown epitaxial layer with merged epitaxial lateral overgrowth (MELO) over patterned carbon regions with silicon carbide pillars in silicon carbide substrate in accordance with an example embodiment.

FIG. 15 is an illustration of epitaxial layer 1400 being doped to lower resistivity in accordance with an example embodiment. To reduce a contact resistance of the device, dopants are implanted on a surface of device epitaxial layer 1400. In one embodiment, a dopant species, dose, energy and other parameters are determined by the design of the Schottky Barrier Diode. In one embodiment, the implanted layer is N+. The implanted dopants are then subsequently annealed to form an ohmic contact region 1500.

Figure 16:
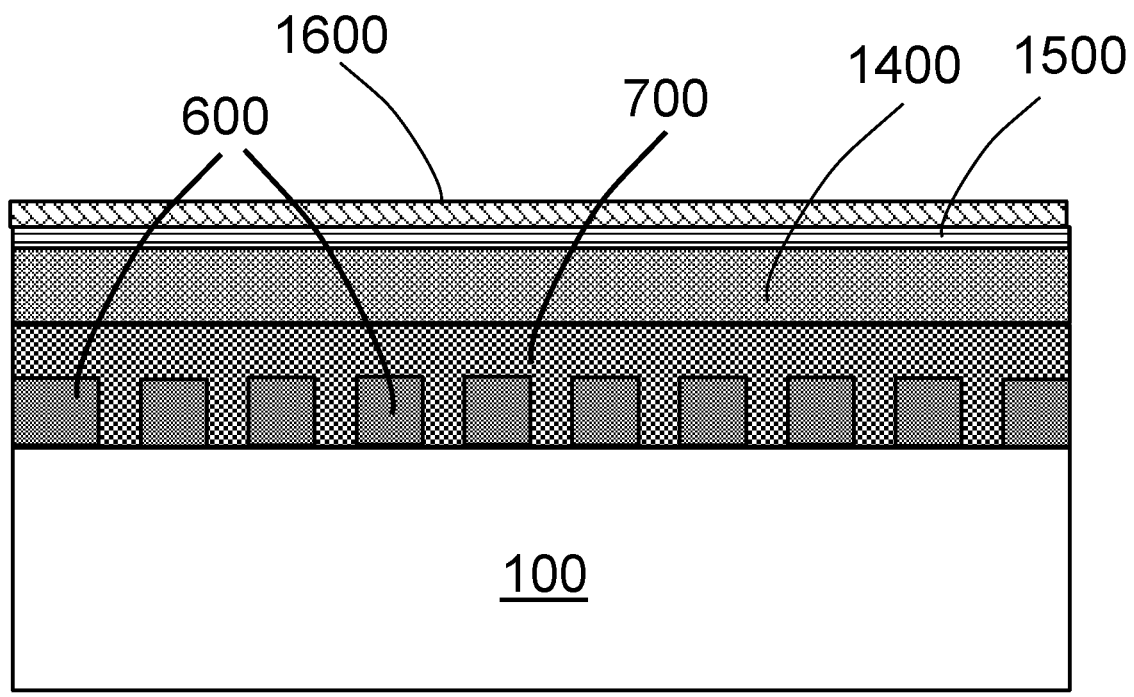
FIG. 16 illustrates a dielectric isolation layer over diode contact region in epitaxially grown layer over an epitaxially grown epitaxial layer with merged epitaxial lateral overgrowth (MELO) over patterned carbon regions with silicon carbide pillars in silicon carbide substrate in accordance with an example embodiment.

FIG. 16 is an illustration of a dielectric isolation layer 1600 deposited on ohmic contact region 1500 on epitaxial layer 1400 in accordance with an example embodiment. Dielectric isolation layer 1600 is deposited by using PECVD Silicon Dioxide, PECVD Silicon Nitride, PECVD, or Silicon Oxynitride among other films. In one embodiment, a thickness of dielectric isolation layer 1600 is in a range of (1-4) micrometers. In the example embodiment, dielectric isolation layer 1600 is PECVD Silicon Oxide and is approximately one micrometer thick.

Figure 17:
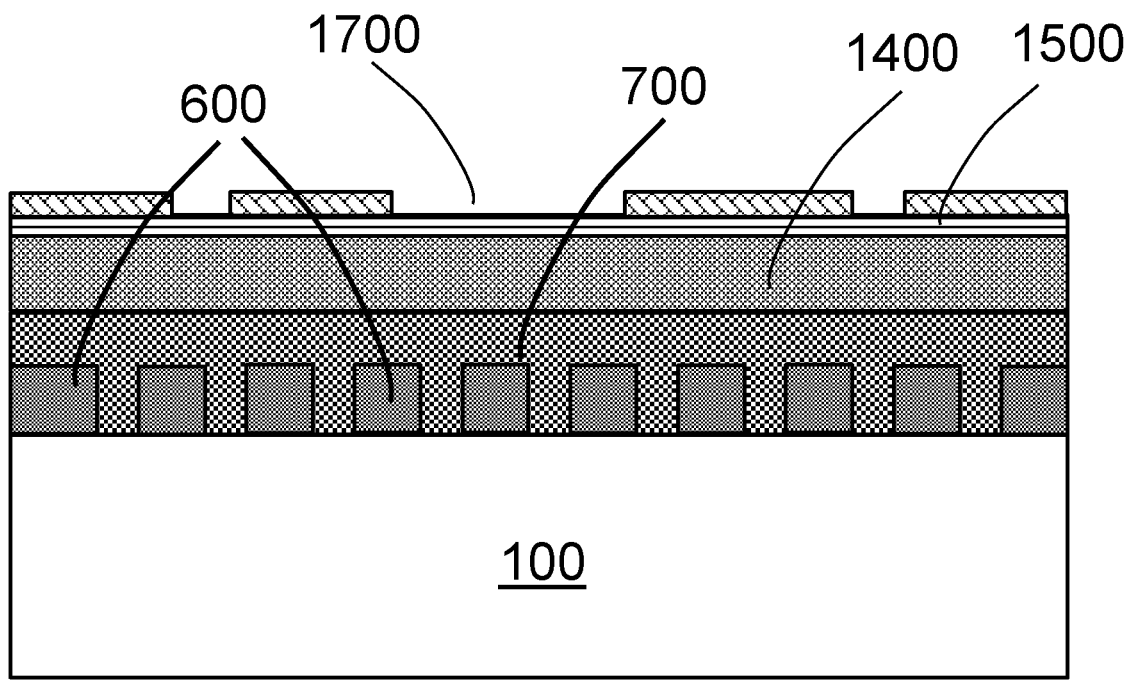
FIG. 17 illustrates a patterned dielectric isolation layer over diode contact region in epitaxially grown layer over an epitaxially grown epitaxial layer with merged epitaxial lateral overgrowth (MELO) over patterned carbon regions with silicon carbide pillars in silicon carbide substrate in accordance with an example embodiment.

FIG. 17 is an illustration of dielectric isolation layer 1600 being patterned in accordance with an example embodiment. Dielectric isolation layer 1600 is patterned and etched using standard wafer processing steps to form contact openings 1700 exposing portion of ohmic contact region 1500 in epitaxial layer 1400. In one embodiment, patterning is done using photolithography techniques and etching of dielectric isolation layer 1600 to form contact openings 1700 is done using RIE (Reactive Ion Etching), wet etching or a combination of etching steps. In the example embodiment, contact openings 1700 are patterned using RIE.

Figure 18:
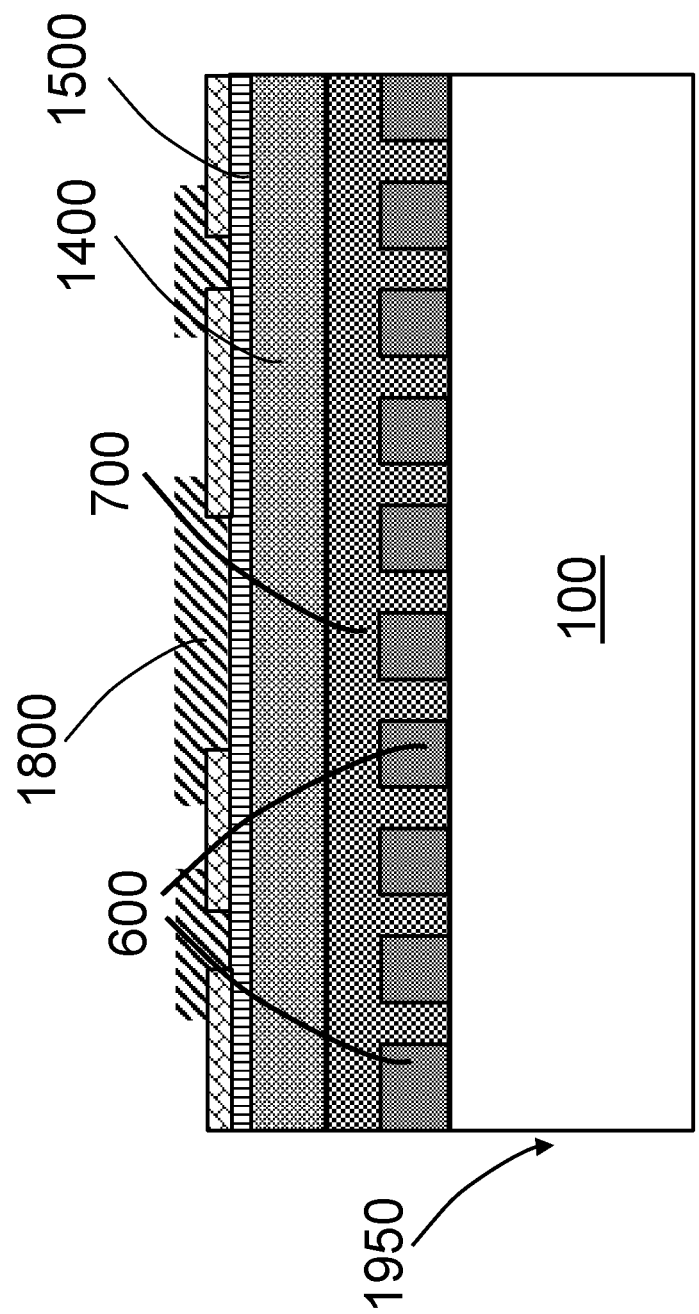
FIG. 18 illustrates patterned metal layer forming one electrode of a Schottky Barrier Diode over patterned dielectric isolation layer over diode contact region in epitaxially grown layer over an epitaxially grown epitaxial layer with merged epitaxial lateral overgrowth (MELO) over patterned carbon regions with silicon carbide pillars in silicon carbide substrate in accordance with an example embodiment.

FIG. 18 is an illustration of a metal contact layer 1800 configured to form an electrode of the Schottky Diode in accordance with an example embodiment. In one embodiment, contact openings 1700 from FIG. 17 are covered with metal contact layer 1800. Metal contact layer 1800 is deposited using sputtering, e-beam evaporation, electrodeposition among other techniques and can also use a combination of metal deposition techniques. Metal contact layer 1800 may be patterned using lithography and etched. In addition, lift-off techniques may also be used for the deposition and patterning of metal contact layer 1800, as will be evident to those skilled in the art. Metal contact layer 1800 may be annealed or sintered to ensure good ohmic contact with ohmic contact region 1500 from FIG. 15. After formation of metal contact layer 1800, a passivation layer may be deposited and patterned to expose bond pads of the example device in accordance with the current invention. At this stage of the example embodiment, the fabrication of a semiconductor device such as the Schottky Barrier Diode is complete in epitaxial layer 1400 formed over epitaxial layer 700 which overlies patterned carbon layer 600, carbon layer 900 of FIG. 9, or carbon layer 1200 of FIG. 12. In an example embodiment, front side metallization results in silicon carbide substrate 100 with Schottky Barrier Diode 1950.

Figure 19:
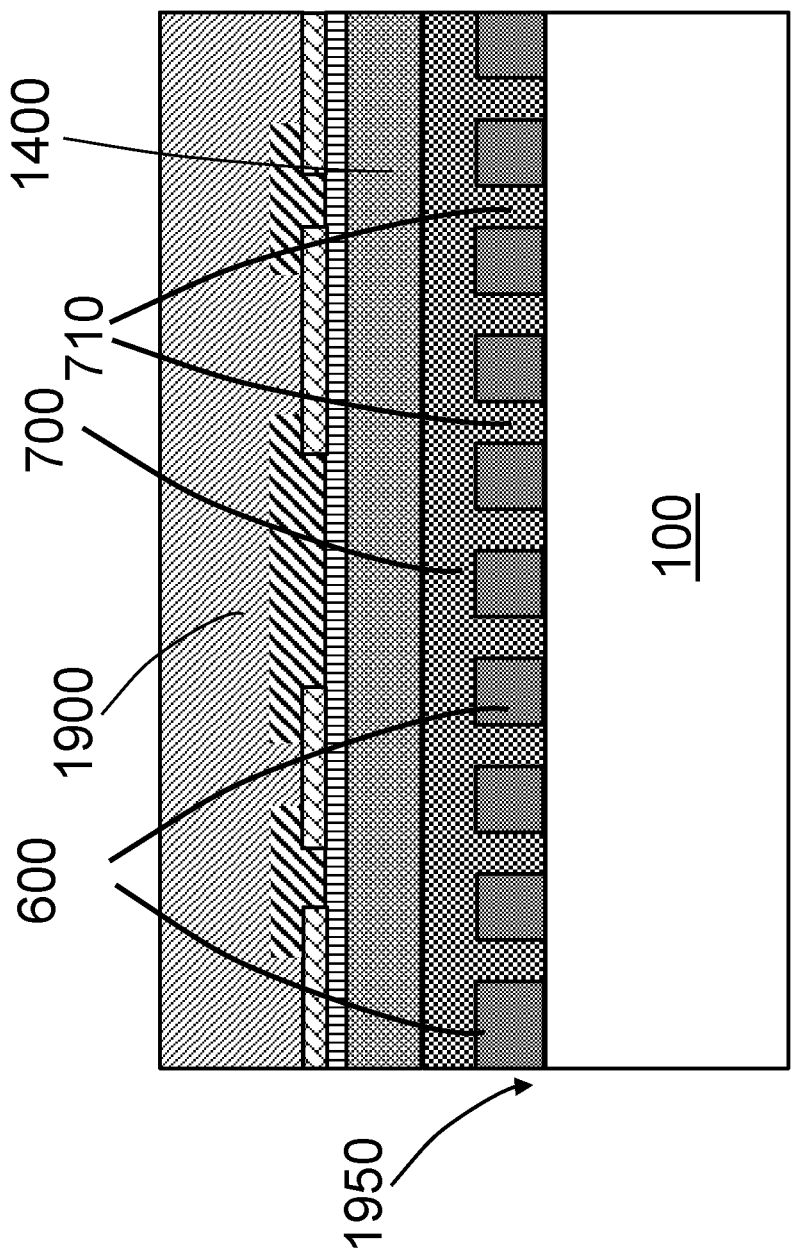
FIG. 19 illustrates a completed Schottky Barrier Diode formed in reusable silicon carbide substrate temporarily bonded to a carrier wafer in accordance with an example embodiment.

FIG. 19 is an illustration of a carrier wafer 1900 temporarily coupled to reusable silicon carbide substrate 100 with Schottky Barrier Diode 1950 in accordance with an example embodiment. In general, carrier wafer 1900 is a substrate used for handling epitaxial layer 700 and epitaxial layer 1400. Silicon carbide substrate 100 with Schottky Barrier Diode 1950 is temporarily coupled to carrier wafer 1900 to enable an exfoliation process. The exfoliation process occurs at an exfoliation layer comprising patterned carbon region 600 adjacent to plurality of silicon carbide pillars 710. Thus, patterned carbon region 600 and plurality of silicon carbide pillars 710 form a layer on a plane where separation occurs during the exfoliation process.

In one embodiment, a plane of the exfoliation layer is substantially parallel to the surface of substrate 100. In one embodiment, silicon carbide substrate 100 with completed Schottky Barrier Diode 1950 is attached to carrier wafer 1900 by adhesives such as UV sensitive glue among others. In the example, epitaxial layer 1400 and epitaxial layer 700 are coupled between silicon carbide substrate 100 and carrier wafer 1900. Carrier wafer 1900 may be borosilicate glass which is UV transparent and may be used with a UV curable adhesive for the bonding. Different methods of exfoliation may be used to separate semiconductor devices formed in device epitaxial layer 1400 overlying epitaxial layer 700 coupled to carrier wafer 1900 along the plane of the exfoliation layer. As an example, the exfoliation process is achieved by using an electrostatic chuck to hold the assembly of silicon carbide substrate 100 with Schottky Barrier Diode 1950 and carrier wafer 1900 and applying normal and shear stresses to fracture the exfoliation layer comprising patterned carbon region 600 and plurality of pillars 710. In another example, the exfoliation process is done using thermal stresses to initiate fracture of the exfoliation layer comprising patterned carbon region 600 and plurality of pillars 710. A combination of techniques may also be used for the exfoliation process of silicon carbide substrate 100 with device epitaxial layer 1400 and epitaxial layer 700. Note that the exfoliation process examples herein above would also work for the exfoliation layer comprising carbonized layer 900 with plurality of pillars 810 of FIG. 10 or carbonized layer 1200 of FIG. 13 filling plurality of micro-voids 1110 in FIG. 11 with plurality of pillars 1120 of FIG. 13.

Figure 20:
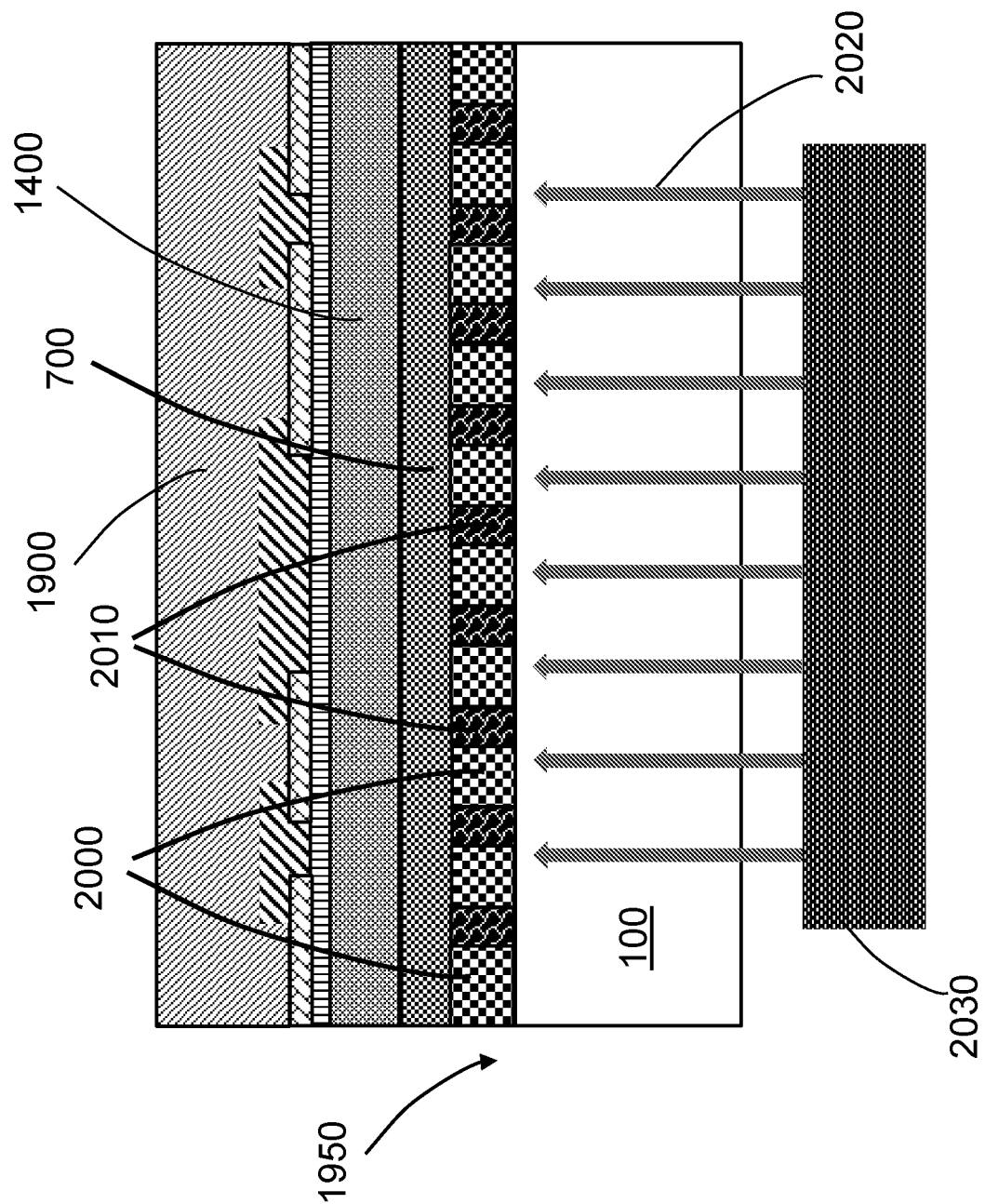
FIG. 20 illustrates a completed Schottky Barrier Diode formed in reusable silicon carbide substrate temporarily bonded to a carrier wafer and scanned with a laser to vaporize silicon carbide pillars in reusable silicon carbide in accordance with an example embodiment.

FIG. 20 is an illustration of a reusable silicon carbide substrate 100 with Schottky Barrier Diode 1950 temporarily coupled to a carrier wafer 1900 undergoing an exfoliation process using a laser 2030 in accordance with an example embodiment. Reusable silicon carbide substrate 100 with Schottky Barrier Diode 1950 temporarily coupled to a carrier wafer 1900 is placed above a laser 2030 such that a laser beam 2020 is scanned into the exfoliating layer comprising patterned carbon region 600 and plurality of silicon carbide pillars 710 from FIG. 19. The wavelength of the laser 2030 is chosen so that it is substantially transparent to reusable silicon carbide substrate 100 and couples the laser energy to the patterned carbon regions 600 from FIG. 19. The laser energy is selectively absorbed by the patterned carbon layer and can reach several thousand degrees of temperature in Celsius. The laser 2030 may be used in continuous or pulsed mode. In one embodiment, laser 2030 is used in pulsed mode so that the energy coupled converts patterned carbon regions 600 to be vaporized or partially vaporized carbonized regions 2000. The energy coupled to the patterned carbon regions 600 from FIG. 19 causes the plurality of silicon carbide pillars 710 in FIG. 19 to be vaporized or partially vaporized thereby forming weak regions of vaporized silicon carbide 2010. By scanning laser beam 2020 of laser 2030, the plane of patterned carbon region 600 and plurality of silicon carbide pillars 710 from FIG. 19 is converted into the exfoliating layer comprising vaporized or partially vaporized silicon carbide 2010 and vaporized or partially vaporized carbonized regions 2000. This exfoliating layer weakly couples to Schottky Barrier Diode 1950 formed in epitaxial layer 700 and epitaxial layer 1400 to reusable silicon carbide substrate 100. Laser 2030 may have a wavelength of 532 nanometers, 1064 nanometers, 623-700 nanometers or 632 nanometers for exfoliation of reusable silicon carbide substrate 100. For Gallium Nitride the appropriate wavelengths may be between 400-1000 nanometers. For silicon substrates, the appropriate wavelengths may be in the UV (Ultra-Violet) range of 350 nanometers.0. In one embodiment, the laser exfoliation process may be used prior to the device fabrication steps as described in FIG. 15-18. In this embodiment, the plane of patterned carbon region 600 and plurality of silicon carbide pillars 710 from FIG. 19 is converted into the exfoliating layer comprising vaporized or partially vaporized silicon carbide 2010 and vaporized or partially vaporized carbonized regions 2000 prior to any device formation. This exfoliating layer weakly couples the portion of substrate formed in epitaxial layer 700 and epitaxial layer 1400 to reusable silicon carbide substrate 100 prior to any device fabrication. This exfoliating layer enables the portion of substrate formed in epitaxial layer 700 and epitaxial layer 1400 to be partially released from reusable silicon carbide substrate 100 enabling easier exfoliation in a subsequent step after the device fabrication is completed. Laser 2030 may be used to optimize energy coupled to patterned carbon layer by varying the power, pulse width, pulse duration among other parameters. Laser 2030 may be operated to reduce heating of epitaxial layer 700 and epitaxial layer 1400 with a sharp fall off due to selective energy coupling to patterned carbon layer 600 from FIG. 19. By scanning laser 2030 across the entire surface of reusable silicon carbide substrate 100, the exfoliating process produces an exfoliation layer that weakly couples reusable silicon carbide substrate 100 to Schottky Barrier Diode 1950 formed in epitaxial layer 700 and epitaxial layer 1400.

Figure 21:
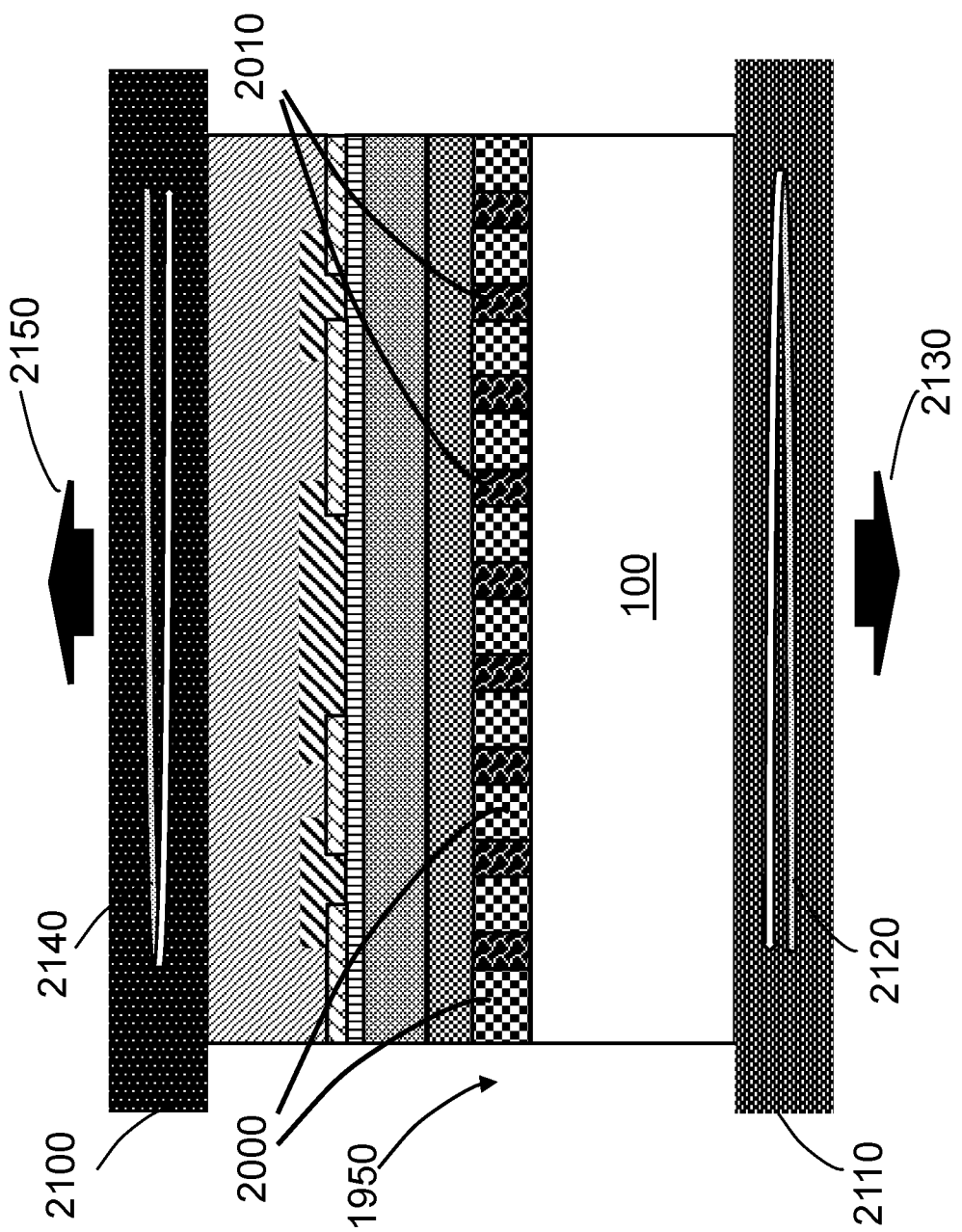
FIG. 21 illustrates a completed Schottky Barrier Diode formed in reusable silicon carbide substrate temporarily bonded to a carrier wafer in an exfoliation tool after scan with a laser to vaporize silicon carbide pillars in reusable silicon carbide substrate in accordance with an example embodiment.

FIG. 21 is an illustration of reusable silicon carbide substrate 100 being separated from Schottky Barrier Diode 1950 in accordance with an example embodiment. As shown, Schottky Barrier Diode 1950 is temporarily coupled between carrier wafer 1900 and reusable silicon carbide substrate 100 by the exfoliation layer comprising vaporized or partially vaporized silicon carbide 2010 and vaporized or partially vaporized carbonized regions 2000.

In one embodiment, reusable silicon carbide substrate 100 with Schottky Barrier Diode 1950 is temporarily coupled to carrier wafer 1900 with exfoliation layer comprising vaporized or partially vaporized silicon carbide 2010 and vaporized or partially carbonized regions 2000 is placed in an exfoliating tool consisting of an upper portion 2100 and a lower portion 2110. A surface of the assembly of carrier wafer 1900 is coupled to upper portion 2100 of the exfoliating tool. Carrier wafer 1900 also couples to Schottky Barrier Diode 1950. The lower portion 2110 of the exfoliating tool is coupled to a surface of reusable silicon carbide substrate 100. Coupling to upper portion 2100 and lower portion 2110 of the exfoliating tool comprises an adhesive layer, UV tape, electrostatic chuck among other methods of coupling.

Exfoliating tool consisting of an upper portion 2100 and a lower portion 2110 to which the assembly of carrier 1900 and Schottky Barrier Diode 1950 and reusable silicon carbide substrate 100 is coupled is capable of exerting pulling forces normal to the surface of the assembly of carrier wafer 1900 and Schottky Barrier Diode 1950 formed overlying reusable silicon carbide substrate 100 and also rotational forces due to torque parallel to surface of carrier wafer 1900 and Schottky Barrier Diode 1950 formed overlying reusable silicon carbide substrate 100.

In one embodiment, pulling force 2150 exerted by upper portion 2100 normal to the surface of the assembly of carrier wafer 1900 and Schottky Barrier Diode 1950 formed overlying reusable silicon carbide substrate 100 may be opposite to pulling force 2130 exerted by lower portion 2110 of exfoliating tool. Rotation force imparted by upper portion 2100 produces torque 2140 parallel to surface of carrier wafer 1900 and Schottky Barrier Diode 1950 formed overlying reusable silicon carbide substrate 100 and may be of opposite direction to torque 2120 produced by lower portion 2110. Pulling force 2150 and 2130 and torque 2140 and 2120 can be computer controlled with sensors providing a feedback mechanism to separately and simultaneously control the pulling forces and shear forces exerted on assembly of carrier wafer 1900 and Schottky Barrier Diode 1950 formed overlying reusable silicon carbide substrate 100. Alternatively, a rotation force can be applied to one of carrier wafer 1900 or reusable silicon carbide substrate 100 instead of both. Similarly, a pulling force can be applied to one of carrier wafer 1900 or reusable silicon carbide substrate 100 instead of both.

Figure 22:
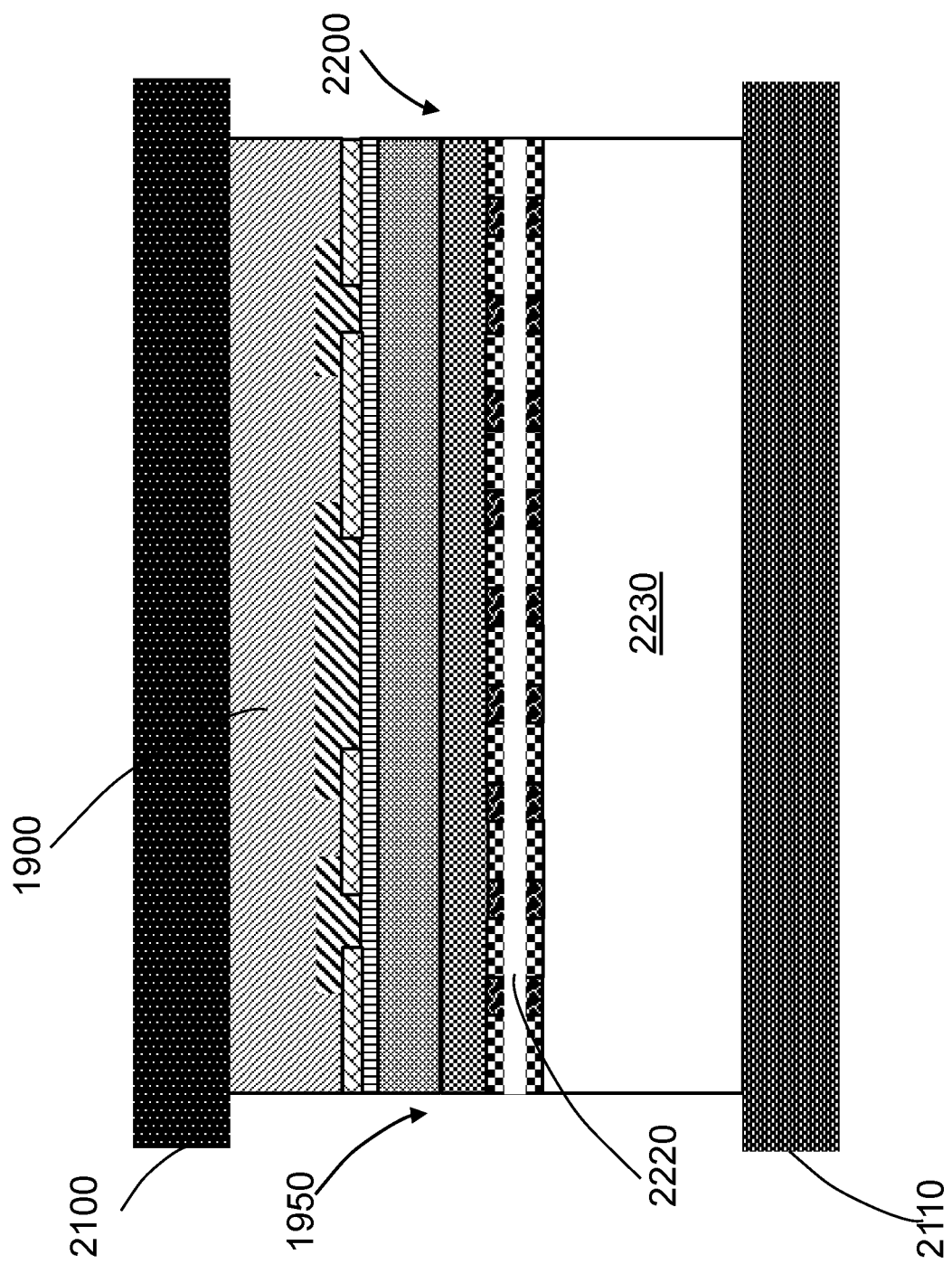
FIG. 22 illustrates exfoliation of Schottky Barrier Diode formed in reusable silicon carbide substrate temporarily bonded to a carrier wafer in an exfoliation tool in accordance with an example embodiment.

FIG. 22 is an illustration of a portion of silicon carbide substrate 2200 with Schottky Barrier Diode 1950 coupled to carrier wafer 1900 after exfoliation in an exfoliation tool in accordance with an example embodiment. Thus, a silicon carbide substrate 2200 is formed after exfoliation along a fracture plane 2220 and separated from a remaining silicon carbide substrate 2230 after the exfoliation process. In the example embodiment, silicon carbide substrate 2200 comprises epitaxial layer 700 and epitaxial layer 1400 both formed of silicon carbide. In one embodiment, assembly of completed Schottky Barrier Diode 1950 fabricated in device epitaxial layer 1400 over epitaxial layer 700 and temporarily coupled to carrier wafer 1900 is exfoliated from remaining silicon carbide substrate 2230 along the plane comprising vaporized or partially vaporized silicon carbide 2010 and vaporized or partially vaporized carbonized regions 2000 from FIG. 21. FIG. 22 is not drawn to scale since thickness of remaining silicon carbide substrate 2230 is in the range of 300-400 micrometers, while the portion of silicon carbide substrate 2200 is in the range of 20-60 micrometers.

Figure 23:
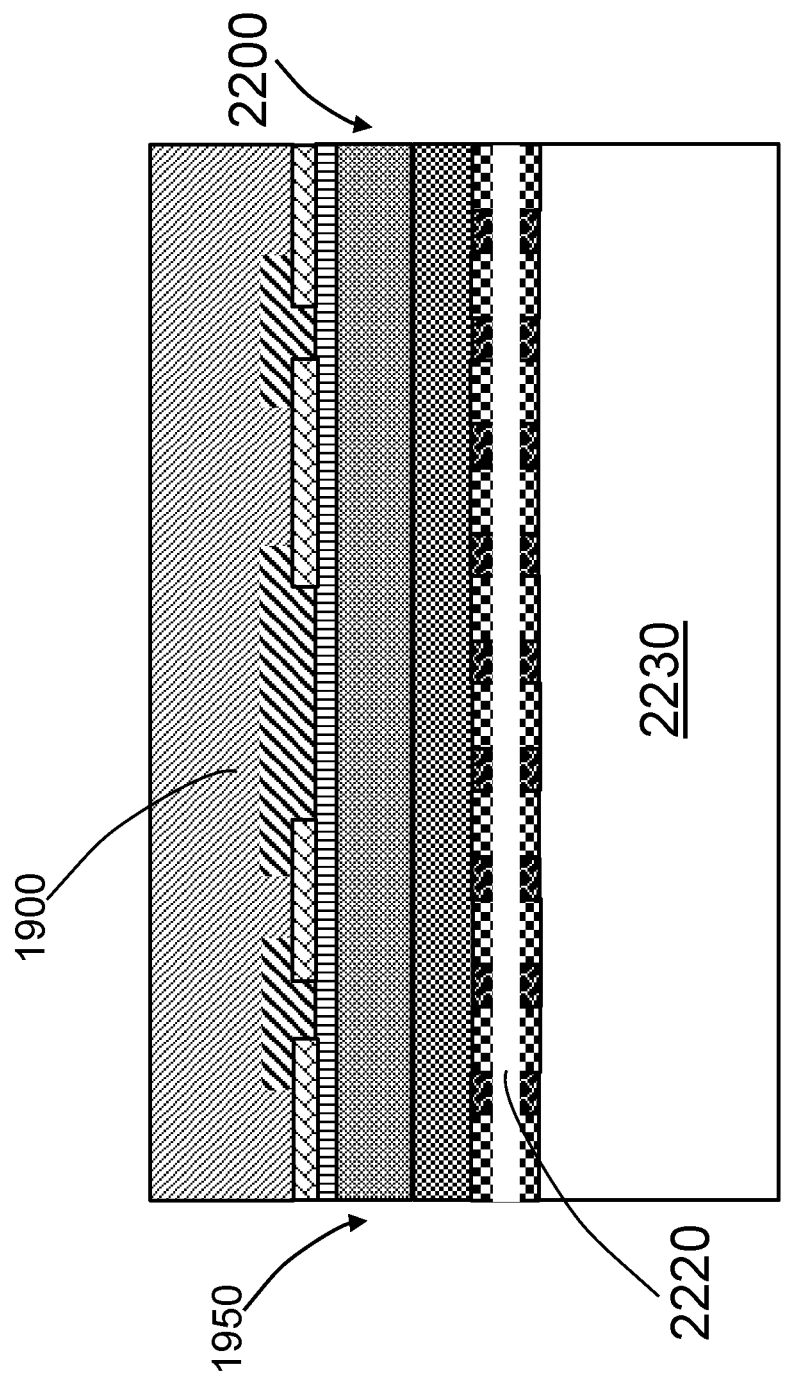
FIG. 23 illustrates exfoliated Schottky Barrier Diode formed in reusable silicon carbide substrate temporarily bonded to a carrier wafer in accordance with an example embodiment.

FIG. 23 is an illustration of a portion of silicon carbide substrate 2200 with Schottky Barrier Diode 1950 coupled to carrier wafer 1900 after removal from the exfoliation tool in accordance with an example embodiment. Thus, a silicon carbide substrate 2200 is formed after exfoliation along a fracture plane 2220 and separated from a remaining silicon carbide substrate 2230 after the exfoliation process. In the example embodiment, silicon carbide substrate 2200 comprises epitaxial layer 700 and epitaxial layer 1400 both formed of silicon carbide. FIG. 23 is not drawn to scale since thickness of remaining silicon carbide substrate 2230 is in the range of 300-400 micrometers, while the portion of silicon carbide substrate 2200 is in the range of 20-60 micrometers.

Figure 24:
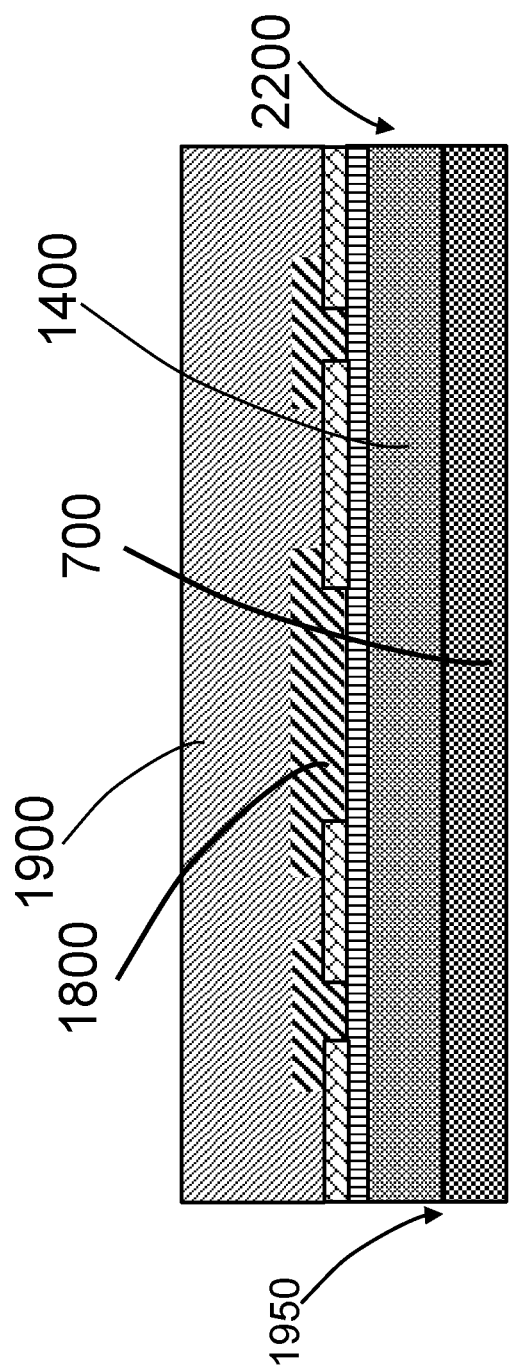
FIG. 24 illustrates exfoliated Schottky Barrier Diode formed in reusable silicon carbide substrate temporarily bonded to a carrier wafer and polished to remove portion of epitaxial layer with patterned carbon regions and plurality of silicon carbide pillars, in accordance with an example embodiment.

FIG. 24 is an illustration of silicon carbide substrate 2200 with Schottky Barrier Diode 1950 coupled to carrier wafer 1900 after removal by the exfoliation tool in accordance with an example embodiment. In one embodiment, silicon carbide substrate 2200 with Schottky Barrier Diode 1950 coupled to carrier wafer 1900 is processed to remove portions of vaporized or partially vaporized silicon carbide 2010 and vaporized or partially vaporized carbonized regions 2000 from FIG. 21. Portions of vaporized or partially vaporized carbonized regions 2000 from FIG. 21 may be removed by etching in an oxygen plasma exposing portions of epitaxial layer 700. In embodiment, epitaxial layer 700 may be polished using chemical mechanical polishing after etching portions of vaporized or partially vaporized carbonized regions 2000 from FIG. 21 in an oxygen plasma.

In the example embodiment, a silicon carbide substrate of a predetermined thickness can be formed using the process disclosed herein above to improve thermal transfer and lower resistance of a silicon carbide device while lowering manufacturing cost.

Figure 25:
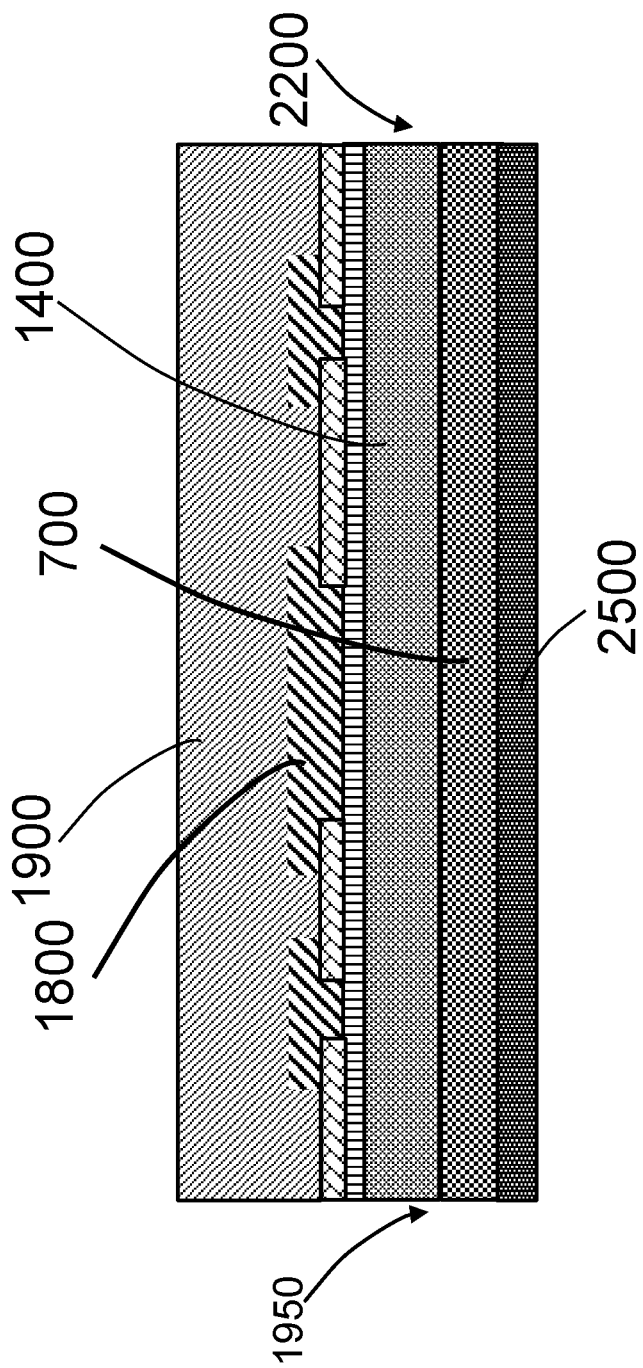
FIG. 25 illustrates the back side metallization for an exfoliated Schottky Barrier Diode in reusable silicon carbide substrate temporarily bonded to a carrier wafer and formed in an epitaxially grown layer over an epitaxially grown epitaxial layer with merged epitaxial lateral overgrowth (MELO) in accordance with an example embodiment.

FIG. 25 is an illustration of a metal layer 2500 deposited on a surface of epitaxial layer 700 in accordance with an example embodiment. In one embodiment, silicon carbide substrate 2200 is coated with metal layer 2500 to form a backside contact of Schottky Barrier Diode 1950. In one embodiment, the surface of epitaxial layer 700 of silicon carbide substrate 2200 is polished and metal layer 2500 is deposited on the surface of epitaxial layer 700 with good ohmic contact using evaporation, sputtering and other methods of metal deposition. Epitaxial layer 700 is formed with N+ doping to ensure good ohmic contact with metal layer 2500. Metals such as nickel, or combination of metals such as Ti/Ni/Au (Titanium/Nickel/Gold) may be used along with annealing to reduce contact resistance to surface of epitaxial layer 700. In one embodiment, laser annealing may be used to reduce contact resistance of metal layer 2500.

Figure 26:
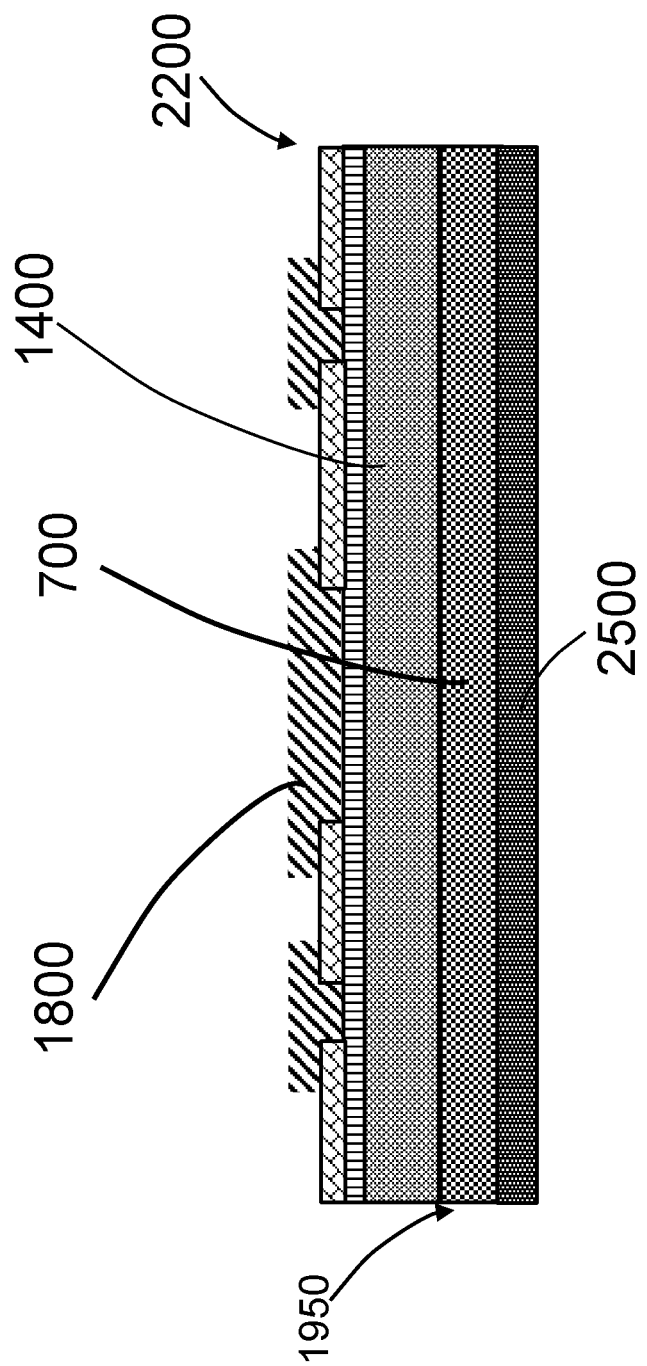
FIG. 26 illustrates a completed Schottky Barrier Diode formed in an epitaxially grown layer over an epitaxially grown epitaxial layer with merged epitaxial lateral overgrowth (MELO) exfoliated from a reusable silicon carbide substrate, in accordance with an example embodiment.
Figure 27:
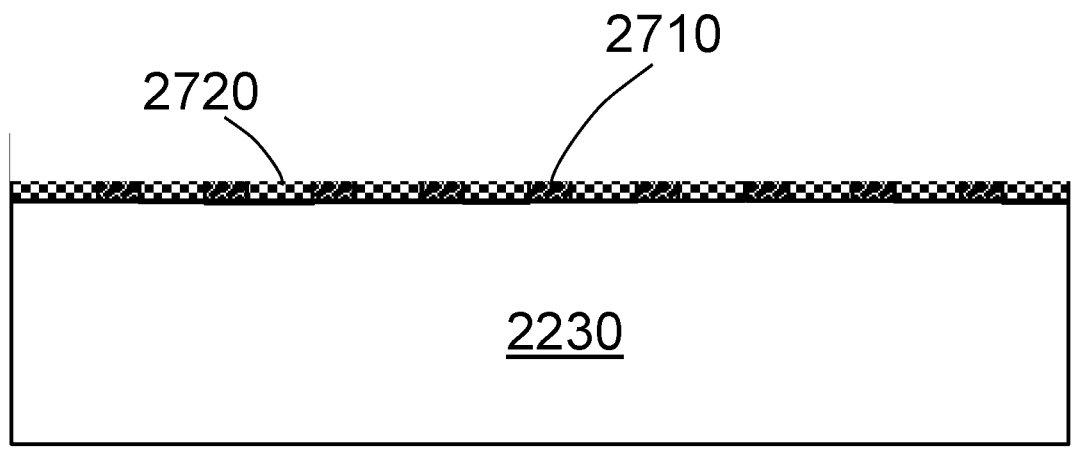
FIG. 27 illustrates a portion of reusable silicon carbide substrate after exfoliation in accordance with an example embodiment.

FIG. 26 is an illustration of silicon carbide substrate 2200 with Schottky Barrier Diode 1950 separated from carrier wafer 1900 of FIG. 25 in accordance with an example embodiment. In one embodiment, after metal layer 2500 is deposited, the entire assembly comprising of silicon carbide substrate 2200 and carrier wafer 1900 is attached to a blue dicing tape. Carrier wafer 1900 is then separated from silicon carbide substrate 2200 which is coupled to the dicing tape. In the example embodiment, silicon carbide substrate 2200 with completed Schottky Barrier Diode 1950 is then diced and assembled in packages FIG. 27 is an illustration of a remaining silicon carbide substrate 2230 separated from silicon carbide substrate 2200 from FIG. 26 after the exfoliation process in accordance with an example embodiment. Remaining silicon carbide substrate 2230 is separated from silicon carbide substrate 2200 with portions of vaporized or partially vaporized carbon region 2720 and vaporized or partially vaporized silicon carbide region 2710 on the surface of remaining silicon carbide substrate 2230. Remaining silicon carbide substrate 2230 is a majority portion of silicon carbide substrate 100 from FIG. 1 after the exfoliation process and is further processed to make remaining silicon carbide substrate 2230 suitable for reuse.

Figure 28:
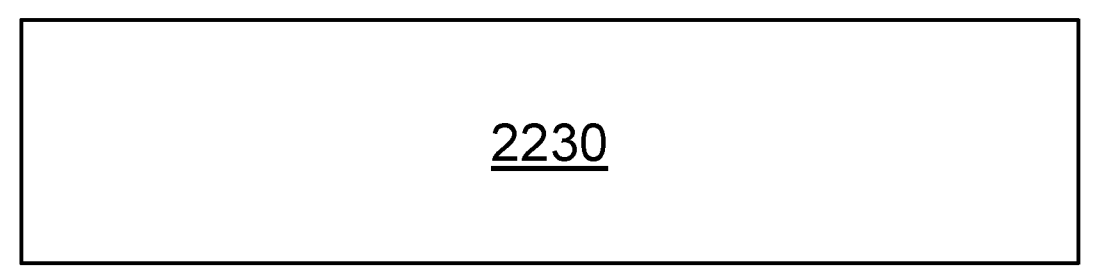

FIG. 28 is an illustration of further processing of the remaining silicon carbide substrate 2230 separated from silicon carbide substrate 2200 from FIG. 26 after the exfoliation process in accordance with an example embodiment. Remaining silicon carbide substrate 2230 separated from silicon carbide substrate 2200 is polished with portions of vaporized or partially vaporized carbon region 2720 and vaporized or partially vaporized silicon carbide region 2710 removed from the surface of remaining silicon carbide substrate 2230 is further processed to make it suitable for reuse.

As previously disclosed herein above, silicon carbide substrate 2230 is a majority portion of silicon carbide substrate 100 from FIG. 20 and is reclaimed by re-polishing a surface exposed to fracture plane 2220 from FIG. 23 such that a polished surface is suitable for formation of semiconductor devices using the current invention. The polishing of the surface of silicon carbide substrate 2230 to form reclaimed silicon carbide substrate 2230 is performed using CMP (chemical mechanical polishing), electrochemical polishing among other methods. Reclaimed silicon carbide substrate 2230 can be used for successive formation of semiconductor devices using the same silicon carbide substrate 100 but with a portion removed by each subsequent exfoliation process.

By successive application of the current invention of formation of patterned carbon region 600 and plurality of silicon carbide pillars 710 from FIG. 7, epitaxial growth of epitaxial layer 700, epitaxial growth of drift region in epitaxial layer 1400, device formation in epitaxial layer 1400, exfoliation by using a laser beam to vaporize carbon region 600 and plurality of silicon carbide pillars 710 and re-polishing of the severed substrate, the reusable silicon carbide substrate 100 may be re-used multiple times. By the successive application of the current invention as described by the example embodiment, the same reusable silicon carbide substrate 100 can be used for fabrication of silicon carbide semiconductor devices leading to significant reduction in the cost of fabrication of silicon carbide semiconductor devices. By application of the exfoliation process using patterned carbon layer and laser exfoliation, silicon carbide devices can be fabricated with lower RDS (drain to source resistance) leading to higher electrical efficiency and lower thermal resistance.

Figure 29:
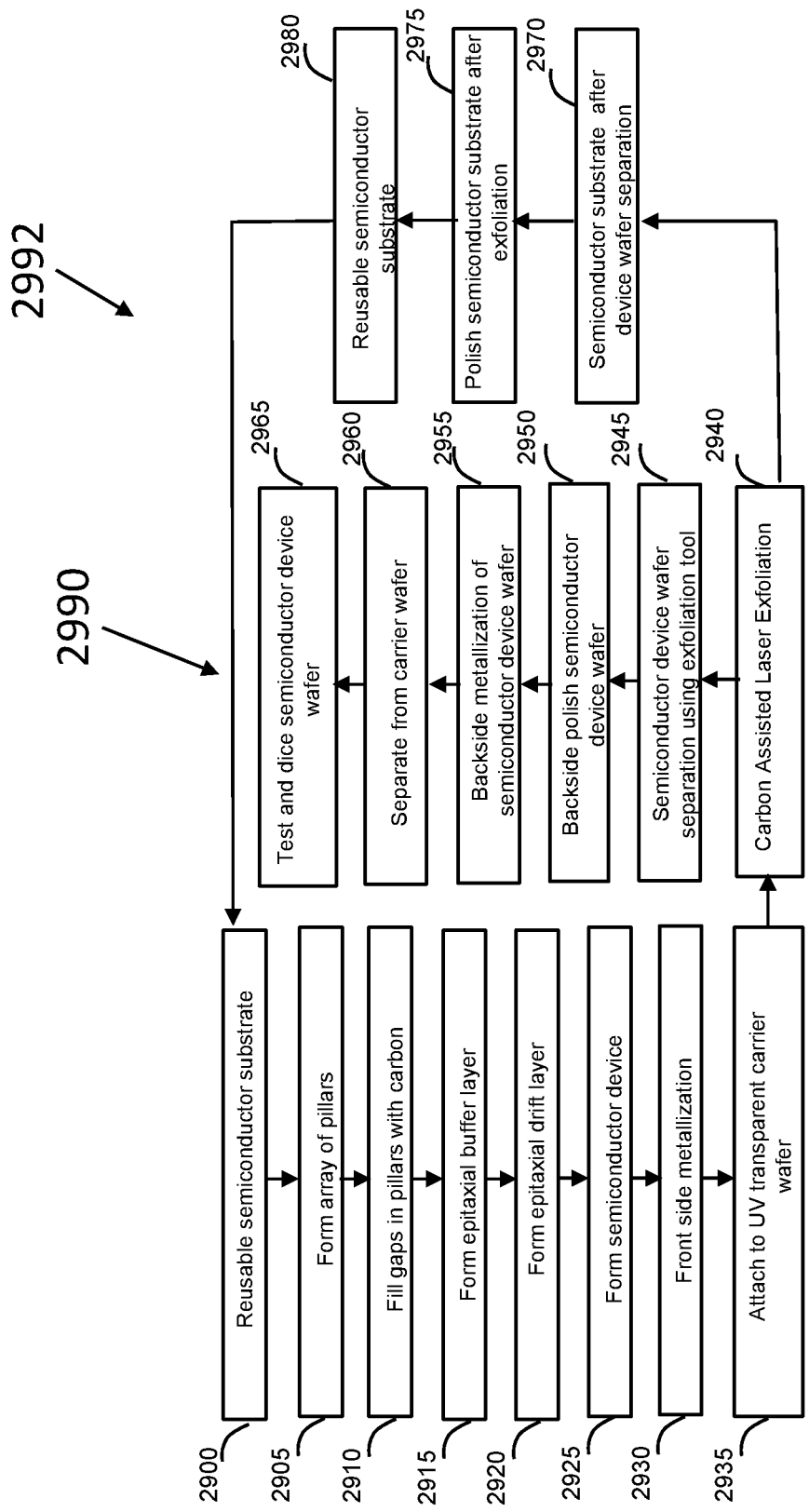
FIG. 29 shows a block diagram implementation of a semiconductor device using a reusable semiconductor substrate.

FIG. 29 is an illustration of a block diagram 2992 of an exfoliation process 2990 in accordance with an example embodiment. Substrate forming process and exfoliation process 2990 supports reuse of semiconductor substrate in the manufacture of semiconductor devices. The order of the blocks in block diagram in FIG. 29 is for illustrative purposes only and does not imply an order or show all the specific steps in the implementation of the invention as are known by one skilled in the art.

In one embodiment, blocks 2900, 2905, 2910, 2915, 2920, 2925, 2930, 2935, 2940, 2945, 2950, 2955, 2960 and 2965 comprises the formation of a substrate and exfoliation process 2990 to separate the substrate from the reusable semiconductor substrate. In the example, the substrate comprises at least a first semiconductor epitaxial layer and a second semiconductor epitaxial layer and semiconductor devices are formed in the substrate. In one embodiment, no semiconductor devices are formed in the semiconductor substrate but the semiconductor substrate is used to form the substrate comprising at least two epitaxial semiconductor layers. In the block diagram 2992, block 2900 illustrates the semiconductor substrate used in an example embodiment. In block 2905, an array of pillars is formed in semiconductor substrate and gaps in pillars are filled with carbon as shown in block 2910. After filling gaps in array of pillars with carbon, buffer epitaxial layer is formed as shown in block 2915 followed by forming of epitaxial drift layer, as shown in block 2920. Buffer epitaxial layer and epitaxial drift layer comprise a semiconductor substrate. Block 2925 illustrates the step of forming at least one semiconductor device. Block 2930 shows the front side metallization of the at least one semiconductor device. Block 2935 shows the step of attaching the completed semiconductor device wafer with front side metallization to a UV transparent carrier wafer. The assembly of completed semiconductor device layer and carrier wafer is then subjected to the exfoliation process 2990.

Block 2940 shows the exfoliation of substrate with at least one semiconductor device after exfoliation process 2990 using a laser to couple to patterned carbon layer in gaps of pillars formed in semiconductor substrate such that the semiconductor substrate is separated from the substrate comprising at least two semiconductor epitaxial layers.

Block 2945 shows semiconductor substrate comprising at least two semiconductor epitaxial layers with at least two semiconductor devices separated using an exfoliation tool. Block 2950 shows the step of polishing backside of the substrate followed by block 2955 showing the step of backside metallization of the substrate. Block 2960 shows the step of separating the substrate with completed semiconductor devices from the carrier wafer followed by block 2965 showing the step of testing and dicing of the substrate. In the example, a plurality of semiconductor devices is formed on or in the substrate and these are diced to separate the semiconductor devices for packaging. Block 2970 shows the portion of remaining semiconductor substrate after exfoliation of semiconductor device wafer as shown in block 2940. Block 2975 of polishing remaining semiconductor substrate after exfoliation for reuse for multiple semiconductor devices and reuse as reusable semiconductor substrate for formation of semiconductor devices as shown in block 2980. As mentioned herein above, only a fraction of the semiconductor substrate is used in the formation of the substrate. A remaining portion of the semiconductor substrate can be reused to form more substrates and more devices thus, extending the life of the semiconductor substrate and forming the devices on the substrate or a controlled and predetermined thickness.

Figure 30:
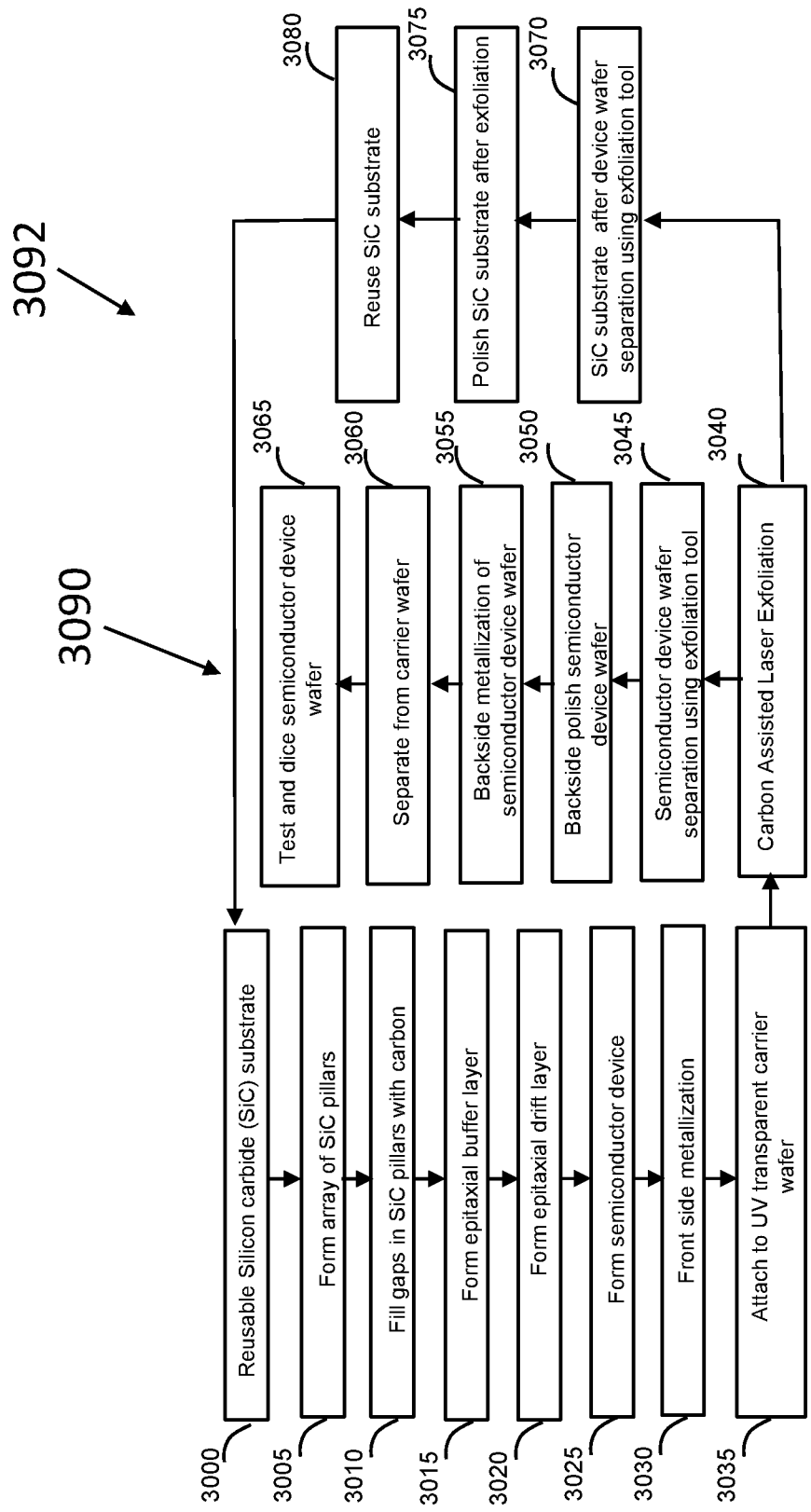
FIG. 30 shows a block diagram implementation of a semiconductor device using a reusable silicon carbide substrate.

FIG. 30 is an illustration of a block diagram 3092 of an exfoliation process 3090 in accordance with an example embodiment. Substrate forming process and exfoliation process 3090 supports reuse of semiconductor substrate in the manufacture of semiconductor devices. The order of the blocks in block diagram in FIG. 30 is for illustrative purposes only and does not imply an order or show all the specific steps in the implementation of the invention as are known by one skilled in the art.

In one embodiment, blocks 3000, 3005, 3010, 3015, 3020, 3025, 3030, 3035, 3040, 3045, 3050, 3055, 3060 and 3065 comprises the formation of a substrate and exfoliation process 3090 to separate the substrate from the reusable semiconductor substrate. In the example, the substrate comprises at least a first semiconductor epitaxial layer and a second semiconductor epitaxial layer and semiconductor devices are formed in the substrate. In one embodiment, no semiconductor devices are formed in the semiconductor substrate but the semiconductor substrate is used to form the substrate comprising at least two epitaxial semiconductor layers. In the block diagram 3092, block 3000 illustrates the reusable silicon carbide substrate 100 used in an example embodiment. In block 3005, an array of pillars 710 is formed in silicon carbide substrate and gaps in pillars are filled with carbon as shown in block 3010. After filling gaps in array of pillars with carbon, buffer epitaxial layer 700 of silicon carbide is formed as shown in block 3015 followed by forming of epitaxial drift layer 1400 of silicon carbide, as shown in block 3020. Buffer epitaxial layer and epitaxial drift layer comprise a semiconductor substrate. Block 3025 illustrates the step of forming at least one semiconductor device. Block 3030 shows the front side metallization 1800 of the at least one semiconductor device. Block 3035 shows the step of attaching the completed semiconductor device wafer in silicon carbide substrate with front side metallization to a UV transparent carrier wafer 1900. The assembly of completed semiconductor device layer in silicon carbide substrate and carrier wafer is then subjected to the exfoliation process 3090.

Block 3040 shows the exfoliation of silicon carbide substrate with at least one semiconductor device after exfoliation process 3090 using a laser 2030 to couple to patterned carbon layer in gaps of pillars formed in silicon carbide substrate such that the silicon carbide substrate is separated from the substrate comprising at least two semiconductor epitaxial layers.

Block 3045 shows silicon carbide substrate comprising at least two silicon carbide epitaxial layers with at least two semiconductor devices separated using an exfoliation tool. Block 3050 shows the step of polishing backside of the substrate followed by block 3055 showing the step of backside metallization 2500 of the substrate. Block 3060 shows the step of separating the substrate with completed semiconductor devices from the carrier wafer followed by block 3065 showing the step of testing and dicing of the substrate. In the example, a plurality of semiconductor devices is formed on or in the substrate and these are diced to separate the semiconductor devices for packaging. Block 3070 shows the portion of remaining silicon carbide substrate 2230 after exfoliation of semiconductor device wafer as shown in block 3040. Block 3075 shows the step of polishing remaining silicon carbide substrate after exfoliation for reuse for multiple semiconductor devices and reuse as reusable silicon carbide substrate for formation of semiconductor devices as shown in block 3080. As mentioned herein above, only a fraction of the silicon carbide substrate is used in the formation of the substrate. A remaining portion of the silicon carbide substrate can be reused to form more substrates and more devices thus, extending the life of the silicon carbide substrate and forming the devices on the substrate or a controlled and predetermined thickness.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

The descriptions disclosed herein below will call out components, materials, inputs, or outputs from FIGS. 1-30.

In one embodiment, an exfoliation process comprises using a reusable silicon carbide substrate 100 with at least one silicon carbide epitaxial layer 700 and a patterned layer having a plurality of silicon carbide regions coupling first reusable silicon carbide substrate 100 to the at least one silicon carbide epitaxial layer 700 wherein patterned layer comprises a second material and wherein a laser 2030 is configured to heat the second material such that the plurality of silicon carbide regions in patterned layer 700 are vaporized or partially vaporized. In one embodiment, patterned layer comprises patterned carbon 600. In one embodiment, the second material that forms a patterned layer comprises tantalum carbide.

In one embodiment, the exfoliation process wherein one or more devices are formed on or in the at least one silicon carbide epitaxial layer 700 and wherein the laser 2030 can couple through the at least one silicon carbide epitaxial layer 700 or the reusable silicon carbide substrate 100 to heat the second material of the patterned layer.

In one embodiment, the exfoliation process wherein a torque is applied to at least one of the reusable silicon carbide substrate 100 or the at least one silicon carbide epitaxial layer 700 to separate reusable silicon carbide substrate 100 from the at least one silicon carbide epitaxial layer 700 after the plurality of silicon carbide regions are vaporized or partially vaporized.

In one embodiment, the exfoliation process wherein a pulling force can be applied to the at least one of the reusable silicon carbide substrate 100 or the at least one silicon carbide epitaxial layer 700 to support the exfoliation process.

In one embodiment, the exfoliation process wherein the reusable silicon carbide substrate 100 is separated from the at least one silicon carbide epitaxial layer 700 and wherein reusable silicon carbide substrate 100 is prepared for reuse.

In one embodiment, the exfoliation process wherein each silicon carbide region of the plurality of silicon carbide regions in the patterned layer 600 is adjacent to the second material of the patterned layer.

In one embodiment, the exfoliation process wherein the second material comprises carbon.

In one embodiment, the exfoliation process wherein the at least one silicon carbide epitaxial layer 700 and the plurality of silicon carbide regions of the patterned layer are formed by merged epitaxial layer overgrowth on the reusable silicon carbide substrate 100 and wherein the at least one silicon carbide epitaxial layer 700 has a crystal orientation identical to the first reusable silicon carbide substrate.

In one embodiment, an exfoliation process for separating a reusable silicon carbide substrate 100 from at least one silicon carbide epitaxial layer 700 grown by merged epitaxial layer overgrowth (MELO) on reusable silicon carbide substrate 700 comprising a patterned layer between reusable silicon carbide substrate 100 and the at least one silicon carbide epitaxial layer 700 wherein a plurality of silicon carbide pillars 710 are formed in patterned layer when at least one silicon carbide epitaxial layer 700 is formed, wherein a laser 2030 is configured to heat a material in patterned layer such that the plurality of silicon carbide pillars 710 are vaporized or partially vaporized during the exfoliation process, and wherein a torque is applied to at least one silicon carbide epitaxial layer 700 or reusable silicon carbide substrate 100 to separate at least one silicon carbide epitaxial layer 700 from reusable silicon carbide substrate 100.

In one embodiment, the exfoliation process wherein the laser 2030 has a wavelength in a range of 532 nanometers, 1064 nanometers, 623-700 nanometers, or 632 nanometers.

In one embodiment, the exfoliation process wherein the laser 2030 is pulsed or continuous wave.

In one embodiment, the exfoliation process wherein the material in the patterned layer is carbon.

In one embodiment, the exfoliation process wherein the laser 2030 is configured to heat the carbon in the patterned layer greater than 3000 degrees Celsius.

In one embodiment, the exfoliation process wherein the heat from the carbon is configured to drop by more than 3000 degrees Celsius within ten microns of the at least one silicon carbide epitaxial layer 700 and wherein at least one silicon carbide epitaxial layer 700 has a thickness greater than ten microns.

In one embodiment, the exfoliation process wherein a pulling force can be applied to the at least one of the reusable silicon carbide substrate 100 or the at least one silicon carbide epitaxial layer 700 to support the exfoliation process.

In one embodiment, a exfoliation process for separating substrates comprising a reusable silicon carbide substrate 100, a patterned layer of carbon in or overlying a surface of reusable silicon carbide substrate 100, at least one silicon carbide epitaxial layer 700 formed overlying patterned layer of carbon wherein a plurality of silicon carbide regions in patterned layer couple between reusable silicon carbide substrate 100 and at least one silicon carbide epitaxial layer 700 and wherein at least one epitaxial layer 700 has a crystal orientation of reusable silicon carbide substrate 100.

In one embodiment, the exfoliation process wherein patterned layer 600 of carbon comprises a plurality of trenches 1100 configured to be formed in reusable silicon carbide substrate 100 and a plurality of microvoids 1110 configured to be formed underlying plurality of trenches 1100 wherein adjacent microvoids of plurality of microvoids 1110 do not couple together thereby forming the patterned layer, wherein plurality of microvoids 1110 are configured to be filled or to be partially filled with a polymer and pyrolyzed to carbon 1200, and wherein silicon carbide between plurality of microvoids 1110 comprises the plurality of silicon carbide regions in patterned layer.

In one embodiment, the exfoliation process wherein the patterned layer of carbon comprises a layer of carbon 1200 deposited on the reusable silicon carbide substrate 100 and patterned by a photolithographic process wherein a merged epitaxial layer overgrowth process is configured to grow silicon carbide on exposed areas of the surface of the reusable silicon carbide substrate 100 through the patterned layer and form the at least one silicon carbide epitaxial layer 1300 and wherein the silicon carbide grown on the exposed areas of the surface of the reusable silicon carbide substrate 100 comprises the plurality of silicon carbide regions.

In one embodiment, the exfoliation process wherein a laser 2030 is configured to heat the carbon 1200 in the patterned layer such that the plurality of silicon carbide regions in the patterned layer is vaporized or partially vaporized.

In one embodiment, the exfoliation process wherein on or more devices 1950 are formed in or on the at least one silicon carbide epitaxial layer 700, wherein a torque is applied to at least one silicon carbide epitaxial layer 700 or the reusable silicon carbide substrate 100 to separate at least one silicon carbide epitaxial layer 700 from reusable silicon carbide substrate 700, wherein the patterned layer is configured to release under the shear force applied by the torque, and wherein the separated reusable silicon carbide substrate 2230 can be prepared and used in another exfoliation process.

In one embodiment, the exfoliation can be initiated using the laser prior to device fabrication with the Epitaxial layer attached to the substrate on the edges. Once the front side device fabrication is completed, the handle layer is attached and the edges can be released using a UV laser and the full exfoliation can be completed (please use the right language with the appropriate reference to the figures).

In one embodiment, an entire new thick substrate, from 100 microns to 400 Microns can be grown over the substrate with the release layer with carbon voids and then separated using the process described above. The approach to such growth can be Epitaxial growth following merged Epitaxial overgrowth or high temperature Chemical vapor deposition or physical vapor transport. (Please use the right language with the appropriate reference to the figures.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

What is claimed is:

1. An exfoliation process for separating substrates comprising:
providing a reusable silicon carbide substrate;
forming a patterned layer comprising a plurality of silicon carbide regions and a second material;
growing at least one silicon carbide epitaxial layer on or overlying the patterned layer;
heating the second material such that the plurality of silicon carbide regions are vaporized or partially vaporized; and
separating the at least one silicon carbide epitaxial layer from reuseable silicon carbide substrate.

2. The exfoliation process of claim 1 wherein one or more devices are formed in or overlying the at least one silicon carbide epitaxial layer.

3. The exfoliation process of claim 1 wherein a torque is applied to at least one of the reusable silicon carbide substrate or the at least one silicon carbide epitaxial layer to separate the reusable silicon carbide substrate from the at least one silicon carbide epitaxial layer after the plurality of silicon carbide regions are vaporized or partially vaporized.

4. The exfoliation process of claim 3 wherein a pulling force can be applied to the at least one of the reusable silicon carbide substrate or the at least one silicon carbide epitaxial layer to support the exfoliation process.

5. The exfoliation process of claim 4 wherein the reusable silicon carbide substrate is prepared for reuse.

6. The exfoliation process of claim 1 wherein each silicon carbide region of the plurality of silicon carbide regions in the patterned layer is adjacent to the second material of the patterned layer.

7. The exfoliation process of claim 1 wherein the patterned layer is formed by etching a plurality of trenches in the reuseable silicon carbide substrate and wherein the second material comprises carbon in the plurality of trenches.

8. The exfoliation process of claim 7 wherein the at least one silicon carbide epitaxial layer comprises a first silicon carbide epitaxial layer grown by epitaxial lateral overgrowth and one or more silicon carbide epitaxial layers grown by epitaxial vertical overgrowth, wherein the first silicon carbide epitaxial layer is grown on or overlying the patterned layer, and wherein the one or more silicon carbide epitaxial layers are grown on or overlying the first silicon carbide epitaxial layer.

9. An exfoliation process for separating substrates comprising:
provinding a reuseable silicon carbide substrate;
etching a plurality of trenches in the reuseable silicon carbide substrate to form a patterned layer wherein the plurality of trenches forms a plurality of pillars;
depositing a material in the plurality of trenches of the patterned layer;
growing a first silicon carbide epitaxial layer on or overlying the patterned layer wherein the first silicon carbide epitaxial layer is grown by merged epitaxial lateral overgrowth (MELO);
forming a plurality of devices overlying the first epitaxial layer;
heating the material with one or more lasers wherein heat from the material vaporizes or partially vaporizes the plurality of pillars; and
separating the plurality of devices from the reuseable silicon carbide substrate.

10. The exfoliation process of claim 9 wherein the one or more lasers haves a wavelength in a range of 532 nanometers, 1064 nanometers, 623-700 nanometers, or 632 nanometers.

11. The exfoliation process of claim 10 wherein the one or more lasers is are pulsed or continuous wave.

12. The exfoliation process of claim 9 wherein the material comprises carbon or tantalum carbide.

13. The exfoliation process of claim 9 further including growing one or more silicon carbide epitaxial layers by epitaxial vertical overgrowth wherein the plurality of devices are formed in or overlying the one or more silicon carbide epitaxial layers.

14. The exfoliation process of claim 9 wherein exfoliation occurs along a plane of the patterned layer thereby leaving at least some of the patterned layer on the reuseable silicon carbide substrate and wherein the at least some of the patterned layer is removed from the reuseable silicon carbide substrate to prepare the reuseable silicon carbide substrate for reuse.

15. The exfoliation process of claim 9 further including coupling a carrier wafer to the plurality of devices wherein a pulling force or a torque can be applied to the reusable silicon carbide substrate or the carrier wafer to support separation of the plurality of devices from the reuseable silicon carbide substrate.

16. An exfoliation process for separating substrates comprising:
providing a reusable silicon carbide substrate;
forming a patterned layer in or overlying the reusable silicon carbide substrate wherein the patterned layer includes a plurality of silicon carbide regions and a material such as carbon or tantalum carbide;
growing a first epitaxial layer on or overlying the patterned layer wherein the first epitaxial layer is formed by epitaxial lateral overgrowth; and
growing one or more epitaxial layers on or overlying the first epitaxial layer wherein the one or more epitaxial layers are formed by epitaxial vertical overgrowth wherein one or more devices are formed in or overlying the one or more epitaxial layers; and
heating the material in the patterned layer with one or more lasers to weaken the patterned layer; and
separating the one or more devices from the reuseable silicon carbide substrate.

17. The exfoliation process of claim 16 further including coupling a carrier wafer to the one or more devices wherein a pulling force can be applied to the at least one of the reusable silicon carbide substrate or the at least one silicon carbide epitaxial layer to support the exfoliation process.

18. The exfoliation process of claim 16 wherein the carbon in the patterned layer was parylene or photoresist converted to carbon by pyrolysis.

19. The exfoliation process of claim 16 wherein the one or more epitaxial layers have the same crystal orientation as the reuseable silicon carbide substrate and wherein the one or more epitaxial layers are grown from a surface of the first epitaxial layer comprising merged epitaxial lateral overgrowth.

20. The exfoliation process of claim 16 further including:
preparing a surface of the first epitaxial layer and the one or more epitaxial layers after separation for further wafer processing or packaging; and
preparing a surface of the reuseable silicon carbide substrate after separation for reuse wherein remnants of the patterned layer is removed.

* * * * *